United States Patent [19]

Powers

[11] 4,423,955
[45] Jan. 3, 1984

[54] PHOTOGRAPHIC PRINTING APPARATUS

[75] Inventor: John W. Powers, Brookline, Mo.

[73] Assignee: Western Litho Plate & Supply Co., St. Louis, Mo.

[21] Appl. No.: 362,515

[22] Filed: Mar. 26, 1982

[51] Int. Cl.³ .............................................. G03B 27/04
[52] U.S. Cl. ....................................... 355/99; 355/85; 355/100
[58] Field of Search ....................... 355/18, 50, 51, 85, 355/100, 86, 99, 106

[56] References Cited

U.S. PATENT DOCUMENTS

| | | | |
|---|---|---|---|
| 3,535,039 | 10/1970 | Lakin et al. | 355/100 |
| 3,635,559 | 1/1972 | Harrell et al. | 355/85 |
| 3,810,694 | 5/1974 | Harrell et al. | 355/18 |
| 3,817,618 | 6/1974 | Riley et al. | 355/100 |
| 3,857,635 | 12/1974 | Niehaus | 355/85 X |
| 4,082,455 | 4/1978 | Brigham | 355/100 |
| 4,178,097 | 12/1979 | Sara | 355/100 |
| 4,353,647 | 10/1982 | Harrell et al. | 355/85 |

OTHER PUBLICATIONS

Prints of sheets 1 and 3 of the drawings of application Ser. No. 223,317.
Print of a drawing showing a plate printing apparatus.

Primary Examiner—Richard A. Wintercorn
Attorney, Agent, or Firm—Senniger, Powers, Leavitt and Roedel

[57] ABSTRACT

Apparatus for exposing lithographic plates to light through a film, e.g. a negative, adapted for exposing one plate to light through a film or a plurality of plates to light through a film, having a first carriage with vacuum grippers for picking up a plate and a negative from each of two side-by-side plate stacks and two side-by-side negative stacks, the carriage being adapted to carry the picked-up plates and negatives to an exposure station and deposit them in registration on a platen at the exposure station for exposure of the plates to light through the negatives and through a window movable up and down at the exposure station, the window having vacuum grooves for raising the negatives, the apparatus further having a second carriage with vacuum grippers for gripping the plates exposed at the exposure station and negatives raised with the window and carrying the exposed plates and the films away from the platen and the window and out of the exposure station.

52 Claims, 20 Drawing Figures

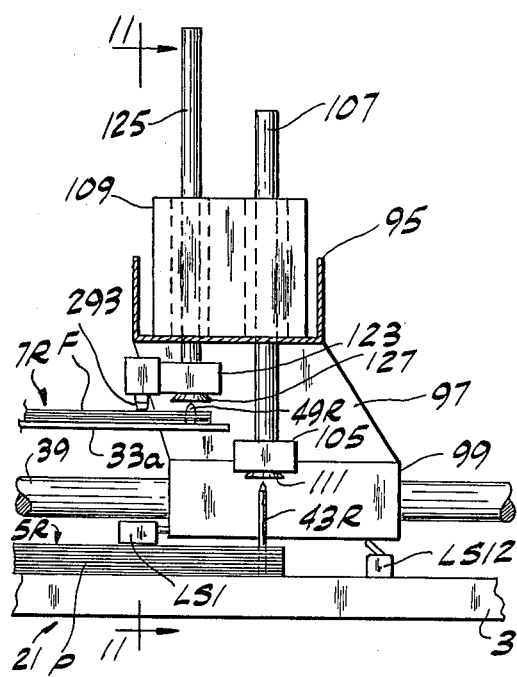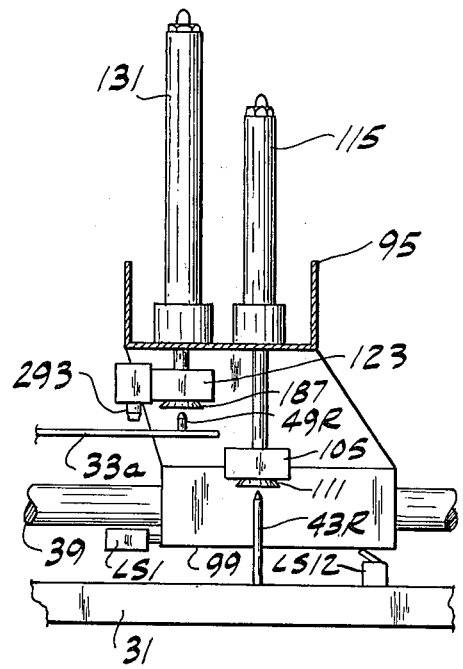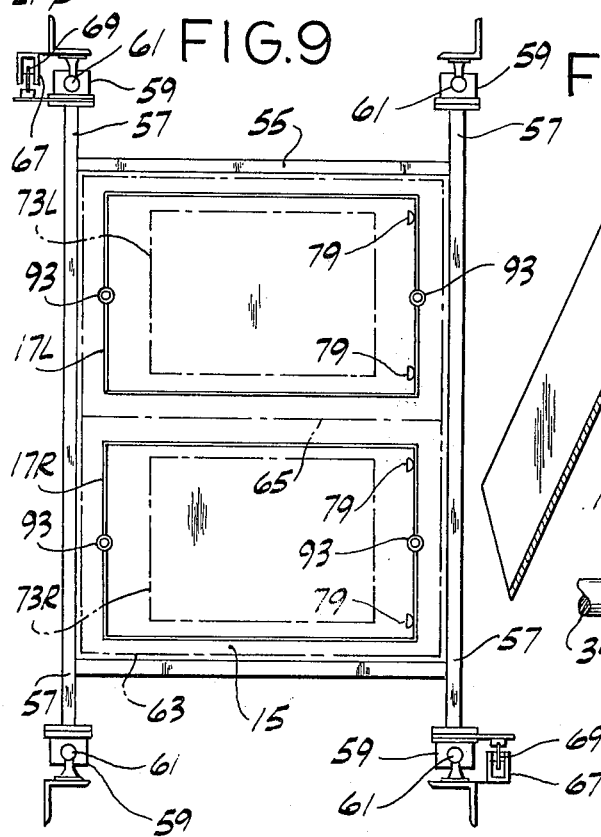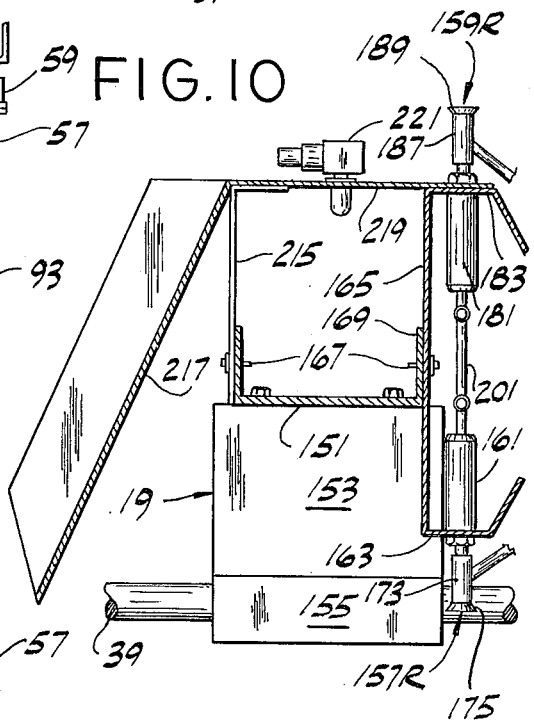

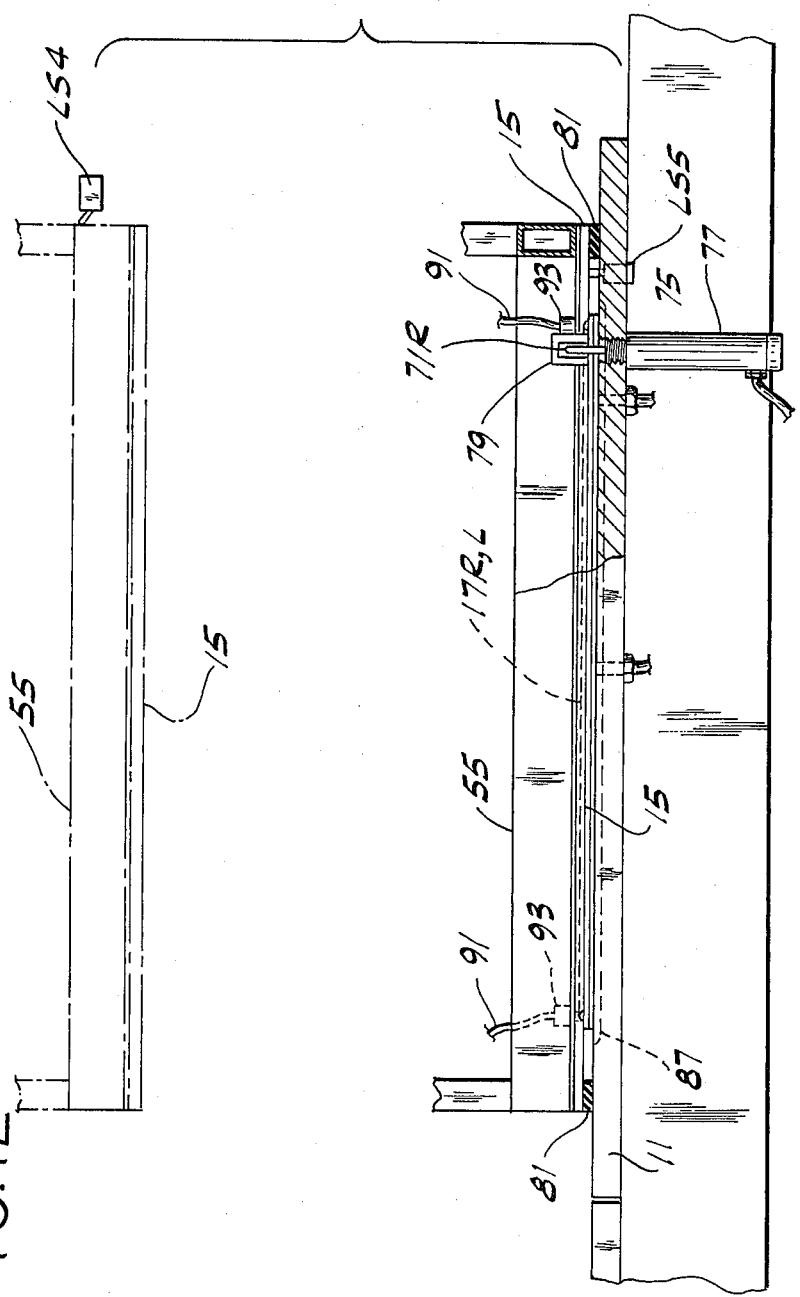

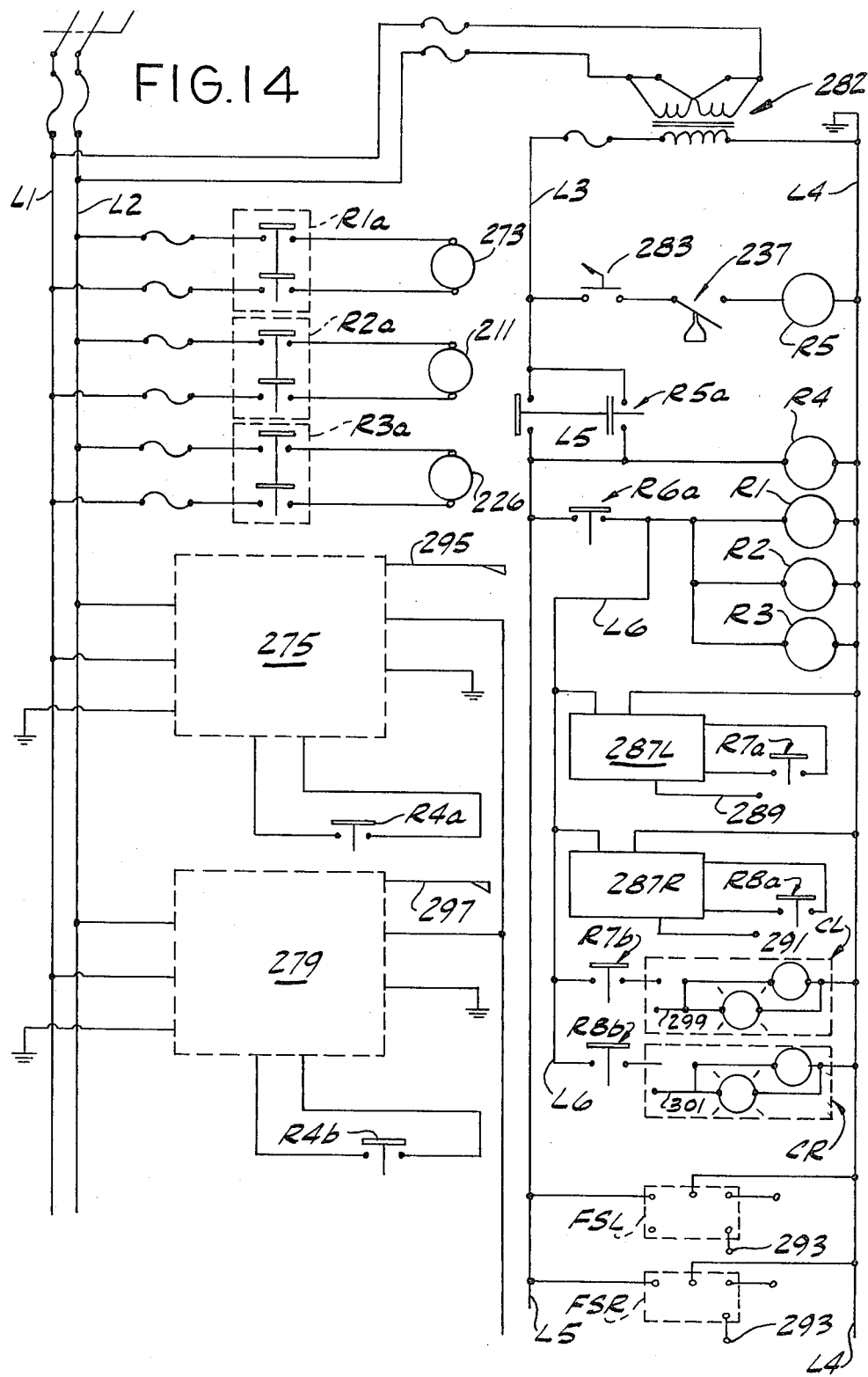

PHOTOGRAPHIC PRINTING APPARATUS

BACKGROUND OF THE INVENTION

This invention relates to photographic printing apparatus, and more particularly to apparatus for automatically carrying photosensitive plates, and especially lithographic plates, through exposure operations.

The invention involves an improvement on the photographic printing apparatus shown in the coassigned copending U.S. Pat. application of Robert E. Harrell et al., Ser. No. 223,317, filed Jan. 8, 1981, now U.S. Pat. No. 4,353,647 issued Oct. 12, 1982 entitled Photographic Printing Apparatus, issued as U.S. Pat. No. 4,353,647, Oct. 12, 1982, which in turn is an improvement on the Photographic Printing Apparatus shown in the coassigned U.S. patent of Robert E. Harrell et al. No. 3,810,694, issued May 14, 1974, entitled Photographic Printing Apparatus, which in turn is an improvement on the photographic printing apparatus shown in the coassigned U.S. patent of Robert E. Harrell et al. No. 3,635,559, issued Jan. 18, 1972, entitled Photographic Printing Apparatus.

SUMMARY OF THE INVENTION

Among the several objects of this invention may be noted the provision of an improved photographic printing apparatus of the type shown in the aforesaid Harrell et al. patents, particularly for automatically and rapidly effecting exposure of lithographic plates to light through films (usually negatives), and efficiently to provide for exposing a plurality of plates to light through the same film in an improved manner as regards the apparatus shown in said application; the provision of such apparatus adapted automatically to deliver plates from a supply of plates and films from a supply of films to an exposure station, to apply each film to a plate at the exposure station with the film in register with the plate, to effect exposure of each plate to light through the film at the exposure station, to effect delivery of an additional plate or additional plates from the supply of plates to the exposure station, while retaining a film at the exposure station for exposure of the additional plate or plates to light through that film, and for discharging each exposed plate and each film from the exposure station when the requisite number of plates have been exposed.

Basically, apparatus of this invention comprises means for holding a stack of plates to be exposed and a stack of films through which plates are to be exposed, with the stack of films above and offset in a rearward direction from the stack of plates so that the stack of plates extends forward from under the stack of films. An exposure station at which a plate is exposed to light through a film is located forward of the stack holding means. Means is provided for delivering a plate from the plate stack and a film from the film stack to an exposure position at the exposure station, this means comprising a carriage movable forward from a retracted position over the stacks to the exposure station, and rearward back to retracted position, and plate gripper means and film gripper means movable up and down on the carriage. The plate gripper means is adapted to grip the top plate of the plate stack forward of the film stack, and the film gripper means is offset rearward from the plate gripper means for gripping the top film of the film stack. Means is provided for operating the carriage, the plate gripper means and the film gripper means to actuate the plate gripper means when the carriage is in retracted position to pick up a plate from the plate stack and to actuate the film gripper means when the carriage is in retracted position to pick up a film from the film stack with the film above and offset rearward from the plate, to move the carriage to a first forward position at the exposure station wherein the plate is adapted on being released to occupy its exposure position, to lower the plate gripper means and release the plate to deposit the plate in exposure position, to advance the carriage farther forward a distance corresponding to the offset of the film from the plate to a second forward position at the exposure station wherein the film is adapted on being released to overlie a plate in exposure position, to lower the film gripper means and release the film to deposit the film in exposure position overlying the plate, and to raise the gripper means and return the carriage to retracted position.

Other objects and features will be in part apparent and in part pointed out hereinafter.

BRIEF DESCRIPTION OF THE DRAWINGS

FIG. 7 is an enlarged section generally on line 7—7 of FIG. 2 showing a first carriage of the apparatus, which may be referred as the infeed or delivery carriage, for delivering plates and films from the stacks to the exposure station of the apparatus;

FIG. 8 is an enlarged section generally on line 8—8 of FIG. 2 showing the infeed or delivery carriage;

FIG. 9 is a plan generally on line 9—9 of FIG. 1 showing a window and its frame at the exposure station;

FIG. 10 is an enlarged section generally on line 10—10 of FIG. 2 showing a second carriage of the apparatus, which may be referred to as the outfeed or discharge or takeaway carriage, for discharging or taking away plates and films from the exposure station following exposure;

FIG. 12 is an enlarged fragment of FIG. 1 with parts broken away and shown in section showing the exposure station.

FIGS. 14 and 15 are electrical circuit diagrams;

Corresponding reference characters indicate corresponding parts throughout the several views of the drawings.

DESCRIPTION OF THE PREFERRED EMBODIMENT

Figure 1:
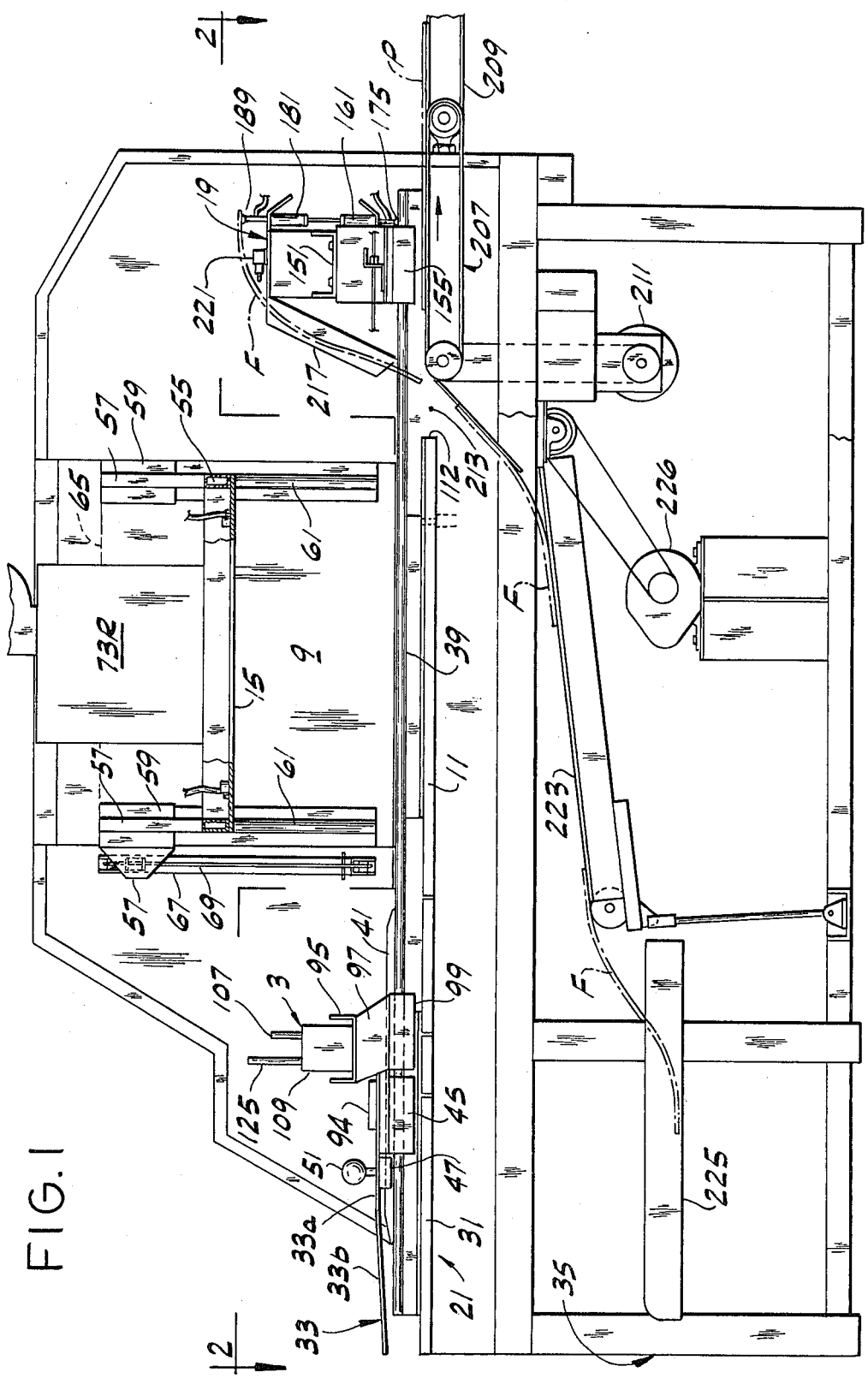
FIG. 1 is side elevation of apparatus of this invention for exposing lithographic plates to light through films, particularly for use in newspaper printing operations to expose plates to light through photographic negatives of the newspaper pages, a housing of the apparatus being broken away.
Figure 2:
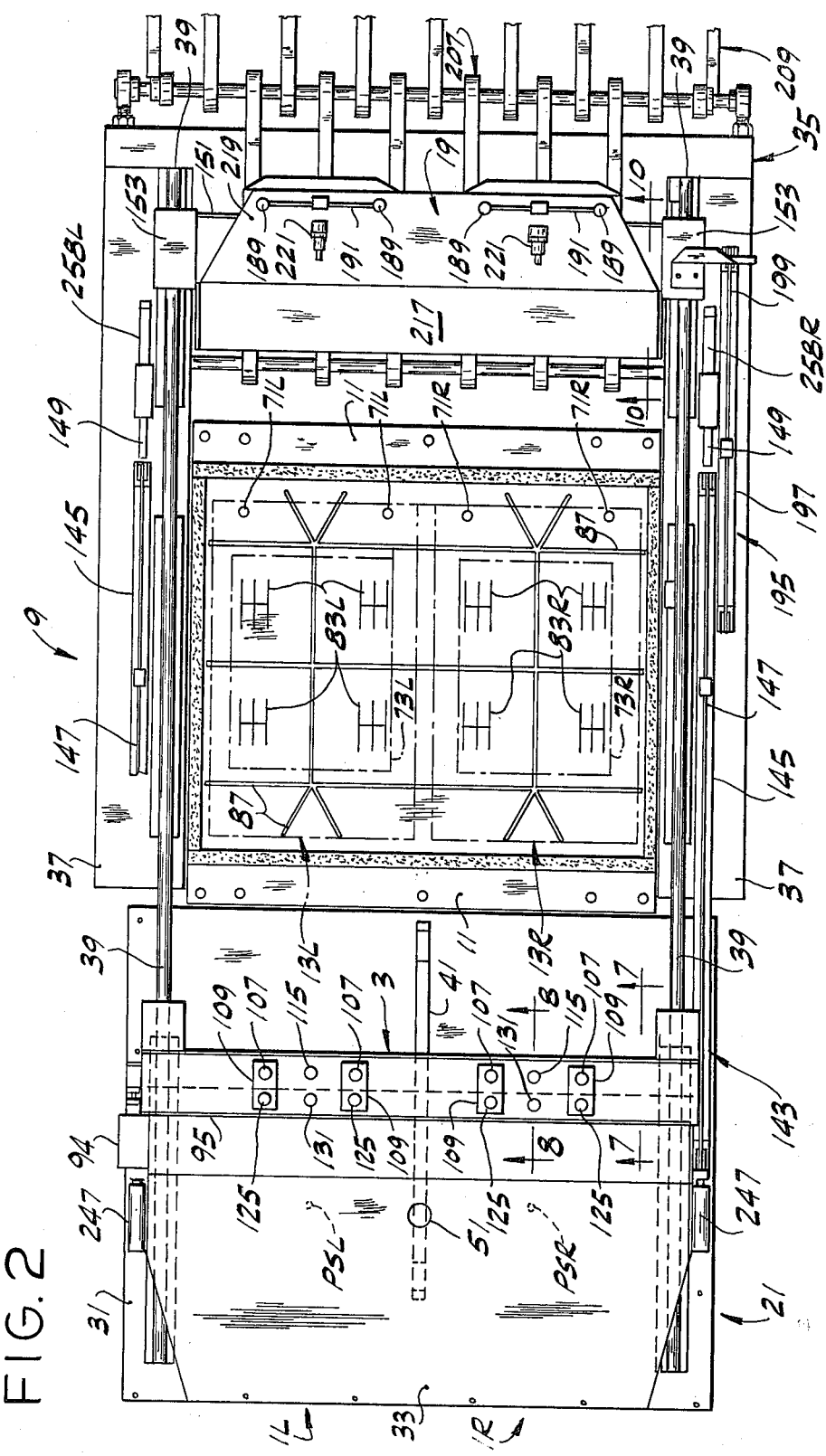
FIG. 2 is a plan of the apparatus with certain parts broken away, the view being generally on line 2—2 of FIG. 1.

The invention is herein described as embodied in apparatus for exposing photosensitized lithographic plates individually designated P, i.e. aluminum plates having a light-sensitive coating on one surface thereof such as are widely used in newspaper printing, to light through films individually designated F, e.g. photographic negatives of newspaper pages to be printed. It will be understood however that, broadly considered, the invention may be embodied in apparatus for exposing other photosensitized plates, and apparatus in which films which are positives may be used instead of negatives. Also, the invention is herein described as embodied in apparatus having two side-by-side exposure lines for simultaneously exposing two single-page plates P to light through two single-page films F (negatives), "single-page" referring to single newspaper pages (generally measuring about 23½"×13½"). One of these exposure lines indicated at 1L in FIG. 2 is referred to as the left-hand exposure line, the other indicated at 1R is referred to as the right-hand exposure line. "Left" and "right" are in reference to viewing the apparatus from its infeed end, looking toward its outfeed end, the direction from the infeed end to the outfeed end being referred to as "forward". In general, the apparatus comprises a first carriage 3, which may be referred to as the infeed or delivery carriage, having vacuum gripper means for picking up a plate P and a film F from each of a left-hand stack of plates at 5L, a right-hand stack of plates at 5R, a left-hand stack of films at 7L and a right-hand stack of films at 7R at the infeed end of the respective exposure lines 1L and 1R, the carriage being movable forward (toward the right as viewed in FIGS. 1 and 2) to carry the picked-up plates and films to an exposure station 9 and deposit them in registration on a platen 11 in exposure positions 13L and 13R at the exposure station for exposure of the plates to light through the films, and through an exposure window 15 which is movable up and down at the exposure station for engagement of its lower face with the films on the plates at the exposure station. The window has left and right-hand sets of vacuum grooves 17L and 17R in its lower face (see FIGS. 9 and 12) for vacuum gripping the films to the lower face (bottom) of the window for raising the films along with the window away from the plates. A second carriage 19, which may be referred to as the outfeed or discharge or takeaway carriage, has vacuum gripper means for gripping plates which have been exposed at the exposure station and for gripping films raised with the window, and is movable forward after having gripped the plates and films to carry the exposed plates away from the platen 11 and the films away from the window and out of the exposure station. Each film may be retained on the bottom of the window at the exposure station, the respective exposed plate discharged, and an additional plate or plates delivered from the respective plate stack for exposure to light through the retained film, the retained film then being discharged concurrently with the discharge of the last plate exposed therethrough. When only one plate is to be exposed through a film, the film is not retained for any additional exposure, but is discharged concurrently with the discharge of the one exposed plate.

The apparatus comprises means indicated generally at 21 at what may be called the stack-holding station for holding the left-hand stack 5L and the right-hand stack 5R of plates to be exposed, and the left-hand stack 7L and the right-hand stack 7R of films through which the plates are to be exposed. The left-hand stack 7L of films is held above and offset in what is termed rearward direction (which is the direction toward the left as viewed in FIGS. 1 and 2) from the left-hand stack 5L of plates and, similarly, the right-hand stack 7R of films is held above and offset in said rearward direction from the right-hand stack 5R of plates. The plates P are rectangular. Each has a pair of registration holes each designated 23 adjacent one edge 25 (one of the narrow edges of the plate) constituting what may be referred to as its forward or leading edge (see FIG. 6). The films F are also rectangular, each having a pair of registration holes 27 corresponding to holes 23 in the plates at its forward or leading edge 29. The left-hand set of stacks 5L and 7L and the right-hand set of stacks 5R and 7R are held side-by-side at the stack-holding station at 21, with the left-hand set at the infeed or entry end (the upstream end) of the left-hand exposure line 1L and the right-hand set at the infeed or entry end (the upstream end) of the right-hand exposure line 1R. As to each set, the plate stack and the film stack in the set are held in transverse register but with the stated longitudinal rearward offset of the film stack from the plate stack, the plate stack extending forward from under the film stack.

The means 21 for holding the stacks at the stack-holding station comprises a table 31 for holding the two plate stacks 5L and 5R and a sliding holder or tray 33 for holding the two film stacks 7L and 7R above and offset rearward from the plate stacks. The table 31 comprises a rectangular top plate mounted in horizontal position on the frame 35 of the apparatus, the table being at a convenient height for placement of the plate stacks on the table by an operator standing at the rearward end of the apparatus. The exposure platen 11, constituted by a flat rectangular metal plate (e.g. aluminum) is mounted on the frame 35 forward of the table with its upper surface generally flush with the upper surface of the table. The platen 11 is somewhat narrower than the table 31. The frame carries narrow elongate plates 37 extending forward from the forward edge of the table along both sides of the platen 11 and projecting beyond the forward edge of the platen 11, the upper surfaces of these side plates being flush with the upper surface of the platen. Guide rails 39 extend longitudinally of the apparatus adjacent the left and right sides of the apparatus on the table and the side plates 37, these rails extending forward well beyond the forward edge of platen 11. A rail 41 extends longitudinally of the apparatus on the table 31 centrally between the rails 39 from a point adjacent the rearward edge of the table to a point adjacent the forward edge of the table.

Figure 3:
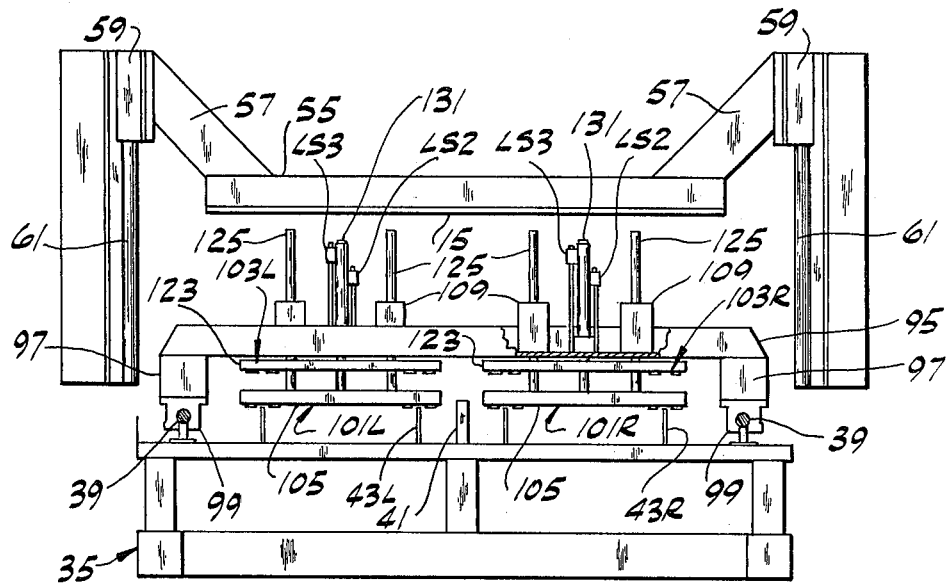
FIG. 3 is a view from the left end of FIG. 1, with parts broken away.
Figure 4:
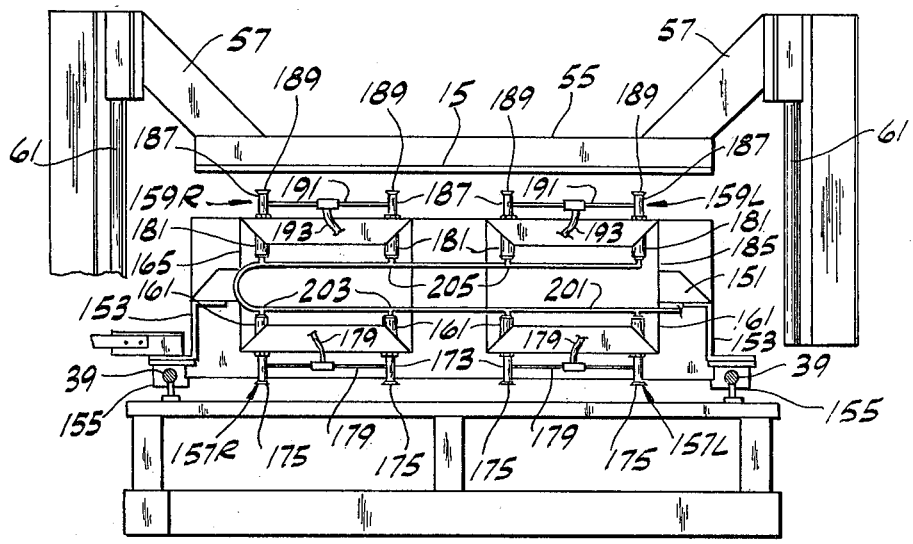
FIG. 4 is a view from the right end of FIG. 1, with parts broken away.

Extending up from the plate stacking table 31 at the left of the central rail 41 in exposure line 1L is a pair of registration pins each designated 43L adapted to enter the registration holes 23 of the plates P of the left-hand plate stack 5L to hold the plates in register one with another in the stack, and in proper position for being picked up for delivery to the exposure station. Extending up from the table at the right of rail 41 is a similar pair of registration pins each designated 43R adapted to enter the registration holes of the plates of the right-hand plate stack 5R to hold these plates in register one with another in the stack, and in proper position for being picked up for delivery to the exposure station. The tray 33 is slidable longitudinally of apparatus above the table 31, having guide bushings 45 at its sides slidable on the side rails 39 and a central guide block 47 (see FIG. 1) slidable on the central rail 41. The tray has a horizontal forward section 33a and an inclined rearward section 33b. Extending up from section 33a at the left in exposure line 1L is a pair of registration pins each designated 49L adapted to enter the registration holes 27 of the films of the left-hand stack 7L to hold these films in register with one another, and extending up from section 33a at the right in exposure line 1R is a similar pair of registration pins 49R for the right-hand film stack 7R. A latch 51 associated with the block 47 comprises a latch pin and a knob on the pin adapted to be pushed down against a spring (not shown) to enter the pin in a hole at 53 in the top of the central rail 41 and then rotated to hold it down for latching the tray in the film pickup position in which it is shown in FIGS. 1–3 wherein the film stacks 7L and 7R registered by means of the pins 49L and 49R on the tray are positioned at the proper rearward offset from the plate stacks 5L and 5R registered on the pins 43L and 43R on the table 31. For example, when the tray is latched in the stated pickup position, the pins 49L and 49R on the tray are offset rearward two inches from the pins 43L and 43R on the table, and thus the film stacks 7L and 7R are offset rearward two inches from the plate stacks 5L and 5R so that the plate stacks extend forward two inches from under the film stacks. On releasing the latch 51, the tray may be slid forward on rails 39 to a position forward of pins 43L and 43R for facilitating the loading of the plate stacks 5L and 5R on the pins 43L and 43R on the table, and slid rearward to a position facilitating loading of film stacks 7L and 7R on the pins 49L and 49R on the tray.

At the exposure station 9, forward of (downstream from) the stack holding means or station 21, the exposure window 15 is movable downwardly toward and upwardly away from the platen 11, being mounted in horizontal position on the bottom of an open rectangular window frame 55 having corner brackets 57 carrying guide bushings 59 slidable on vertical rails 61 extending up from the frame of the apparatus adjacent the four corners of the platen 11. The window frame 55 may have suitable shielding as indicated at 63 on top, this shielding including a vertical separator 65 extending in longitudinal direction in relation to the apparatus centrally of the frame delineating a left-hand half and a right-hand half of the window 15. The window frame 55, carrying the window 15 on its bottom, is movable up and down for raising and lowering the window by means of a pair of air-operated cable cylinders each designated 67 at two diagonally opposite corners of the window frame, the cables 69 of these cylinders being attached to the guide bushings 59 at the respective corners.

At the left of the exposure station platen 11 in the left-hand exposure line 1L is a pair of registration pins each designated 71L adapted to enter the registration holes of a plate P and film F and to hold the plate and film in register one with another on the platen 11 in the exposure position indicated at 13L in FIG. 2 for exposure of the plate to light through the film. At the right of platen 11 in the right-hand exposure line 1R is a similar pair of registration pins each designated 71R similarly adapted to hold a plate and film in register and in the exposure position indicated at 13R in FIG. 2. Exposure of the plate through the film at 13L is via a left-hand high intensity lamp 73L, and exposure of the plate through the film at 13R is via a right-hand high intensity lamp 73R, these lamps being mounted above the window 15 (and indicated in phantom in FIG. 2). Lamp 73L is positioned to beam light down through the left-hand half of the window; lamp 73R is positioned to beam light down through the right-hand half of the window. Pins 71L are in alignment longitudinally of the apparatus with pins 43L and pins 49L; pins 71R are in alignment longitudinally of the apparatus with pins 43L and pins 43R. Pins 71L and 71R are movable up and down in holes 75 in platen 11 by means of air cylinders 77 (see FIG. 12), each being movable by means of its respective air cylinder between a lowered retracted position wherein its upper end is clear of the upper surface of platen 11 and a raised position projecting up above the upper surface of the platen for extending through the registration holes of a plate on the platen and a film on the plate at positions 13L and 13R. Cups such as indicated at 79 are provided on the window 15 for receiving the extended pins 71L, 71R when the window 15 is lowered. The platen 11 has a relatively thin flat resilient sealing strip 81 (e.g. a strip of a suitable rubber) extending all around it engageable by the window when it is lowered. It also has a left-hand set 83L and a right-hand set 83R of vacuum grooves in its top surface for vacuum gripping plates down on the platen at 13L and 13R. Means for drawing vacuum in these grooves 83L, 83R in the platen 11 for plate gripping comprises a vacuum line system such as indicated at 85 in FIG. 13B under the platen. The platen 11 also has a set of vacuum grooves 87 in its top surface for drawing a vacuum in the space between the window 15 and the platen when the window is moved down into engagement with the sealing strip 81 to force the window down into pressurized engagement with the films and plates at 13L and 13R, the sealing strip being squeezed as this occurs. The window has the aforesaid left-hand set 17L and right-hand set 17R of vacuum grooves in its bottom for vacuum gripping a left-hand film and a right-hand film to the bottom of the window, and means for drawing vacuum in these grooves for film gripping comprising flexible vacuum lines 91 (flexible to allow for the raising and lowering of the window) connected as indicated at 93 to the top of the window and in communication with the grooves through holes in the window.

Carriage 3 and the vacuum gripper means carried thereby constitutes means for delivering a plate P from each of the plate stacks 5L, 5R and a film F from each of the film stacks 7L, 7R to the respective exposure position 13L, 13R at the exposure station 9. The carriage 3 is movable forward from the retracted plate and film pickup position over the stacks in which it is shown in FIGS. 1, 2, 7, 8, 11 and 16, determined by its engagement with stops 94, to the exposure station 9, and rearward back to retracted position. It comprises an elongate channel-section bridge member 95 mounted at its ends on supports 97 on guide bushings 99 slidable on the left and right side rails 39, the channel 95 extending transversely of the apparatus at an elevation above the tray 33. Vacuum gripper means 101L is movable up and down on the carriage at the left for gripping the top plate P of the left-hand plate stack 5L and delivering it to position 13L at the exposure station, and similar vacuum gripper means 101R is movable up and down on the carriage at the right for gripping the top plate P of the right-hand plate stack 5R and delivering it to position 13R at the exposure station. Vacuum gripper means 103L is movable up and down on the carriage at the left for gripping the top film F of the left-hand film stack 7L and delivering it to position 13L at the exposure station, and similar vacuum gripper means 103R is movable up and down on the carriage at the right for gripping the top film F of the right-hand film stack 7R and delivering it to position 13R at the exposure station.

Figure 5:
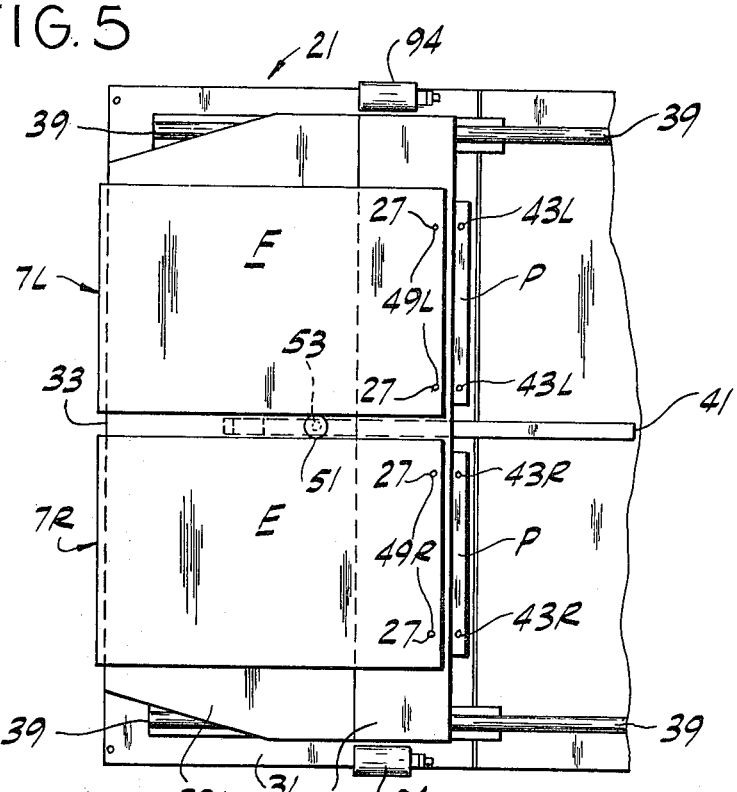
FIG. 5 is a fragment of FIG. 2 with parts broken away showing what is called the stack-holding station of the apparatus, and showing two stacks of films on a film tray and two stacks of plates at this station.
Figure 6:
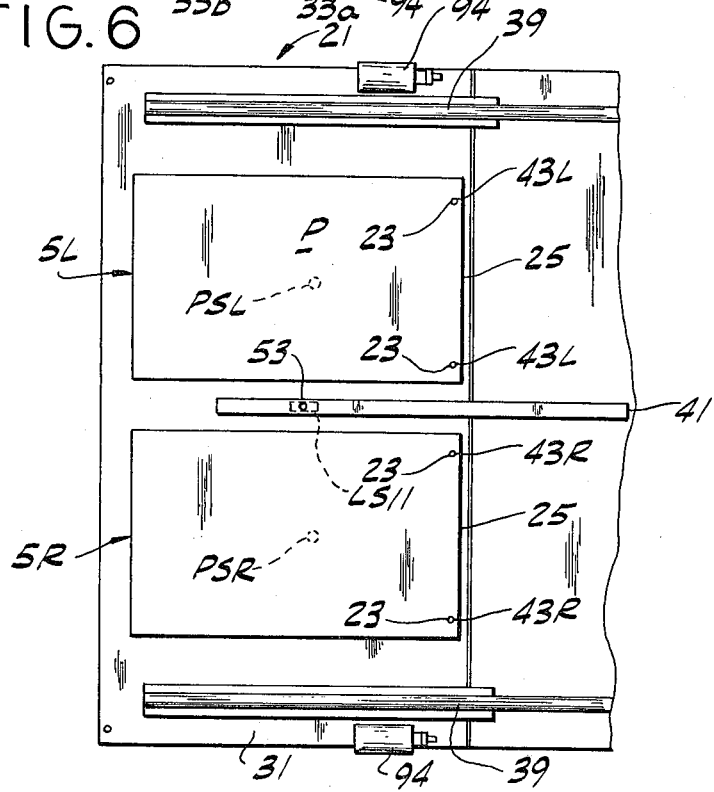
FIG. 6 is a view similar to FIG. 5 but with the tray and film stacks omitted.

Each plate vacuum gripper means 101L and 101R comprises a plate pickup head 105 constituted by a crossbar at the lower end of a pair of rods 107 vertically slidable in bearings 109 on the carriage, and downwardly facing suction cups 111 mounted in the head at its bottom. Means for drawing vacuum in the suction cups includes flexible vacuum lines 113 (see FIG. 13A) connected to the heads 105 and suitable passaging in the heads to the cups. Each plate pickup head 105 is movable downwardly from the raised retracted position in which it is illustrated in FIGS. 5 and 6 by an air cylinder 115 mounted on bridge member 95 of the carriage 3 having its piston rod 117 extending down from its piston through a hole in the bridge member to a connection with the head. The two cylinders 115 are adapted to be supplied with air and vented for moving both the left-hand and right-hand heads 105 up and down in unison via an air system indicated generally at 119 including flexible lines 121 allowing for the movement of the carriage 3.

Each of the film vacuum gripper means 103L and 103R comprises a film pickup 123 constituted by a head at the lower end of a pair of rods 125 vertically slidable in the bearings 109 on bridge member 95, and downwardly facing suction cups 127 mounted in the head at its bottom. Means for drawing vacuum in the suction cups includes flexible vacuum lines 129 similar to lines 113. Each film pickup head 123 is movable downwardly from the raised retracted position in which it is illustrated in FIGS. 7 and 8 by an air cylinder 131 mounted on the bridge member 95 having its piston rod 133 extending down from its piston through a hole in the bridge member to a connection with the head 123. The two cylinders 131 are adapted to be supplied with air and vented for moving both the left-hand and right-hand heads 123 up and down in unison via an air system indicated generally at 135 including flexible lines 137 allowing for the movement of the carriage (see FIG. 13A).

The two plate pickup heads 105 are located in a vertical plane extending transversely with respect to the apparatus toward the forward side of the carriage and the two film pickup heads 123 are located in a vertical plane extending transversely with respect to the apparatus offset rearward (e.g. two inches) from the plane of the plate pickup heads 105. The film pickup heads 105 in their raised retracted position are located at a higher elevation than the plate pickup heads (see FIG. 5), the arrangement being such that, with the heads 123 and heads 105 raised, the carriage is adapted to move rearward to its retracted plate and film pickup position wherein the film pickup heads 123 are disposed above the forward ends of the film stacks 7L and 7R in register with the film registration pins 49L, 49R adjacent the forward ends of the film stacks, and wherein the plate pickup heads 105 are disposed above the forward ends of the plate stacks 5L and 5R in register with the plate registration pins 43L, 43R adjacent the forward ends of the plate stacks and forward of the film stacks. The heads 105 have holes 139 which then register with pins 43L, 43R and the heads 123 have holes 141 which then register with pins 49L, 49R.

Figure 11:
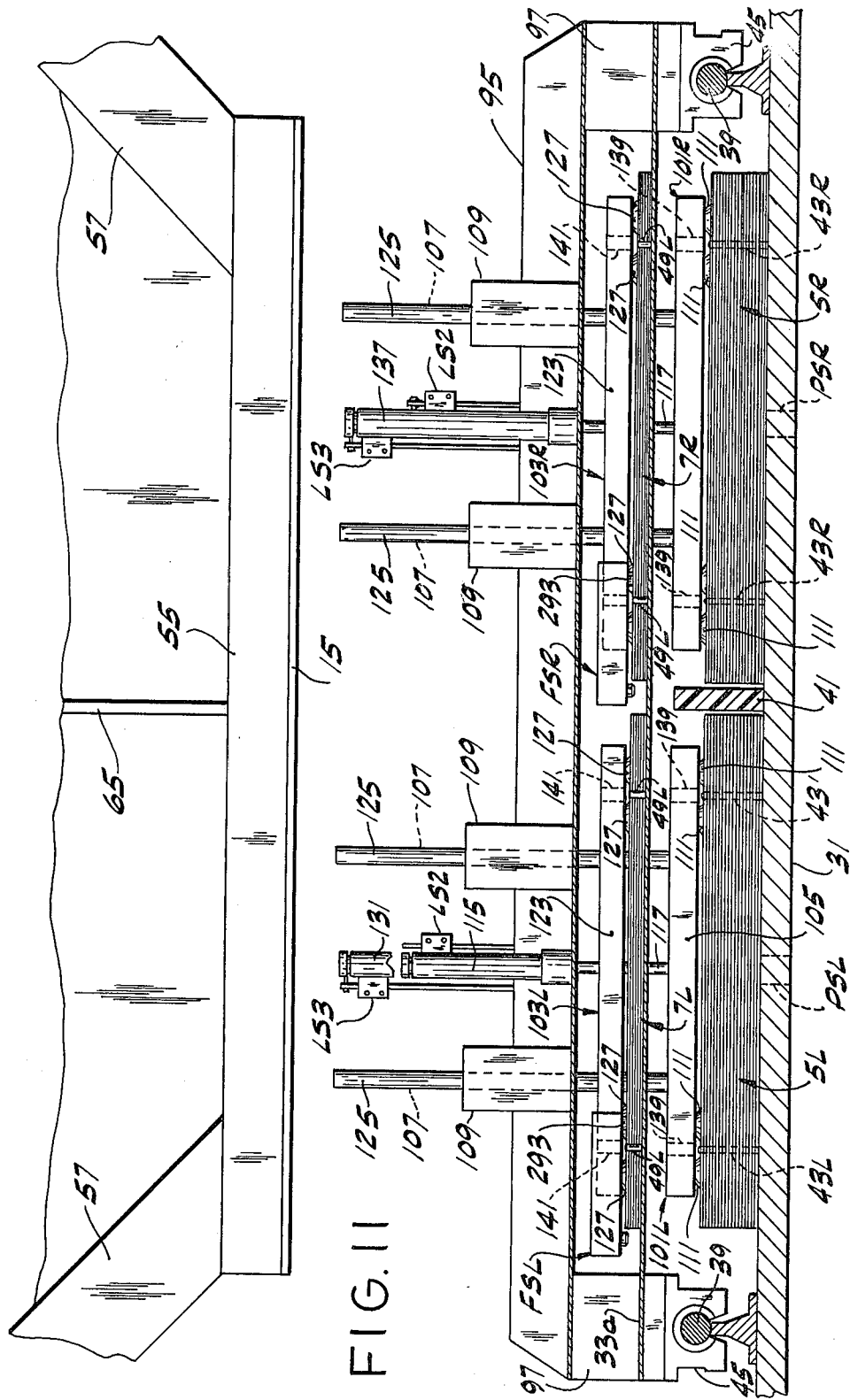
FIG. 11 is an enlarged section generally on line 11—11 of FIG. 7 showing plate pickup heads of the apparatus moved down to pick up the top plates of the plate stacks and film pickup heads of the apparatus moved down to pick up the top films of the film stacks.
Figure 17:
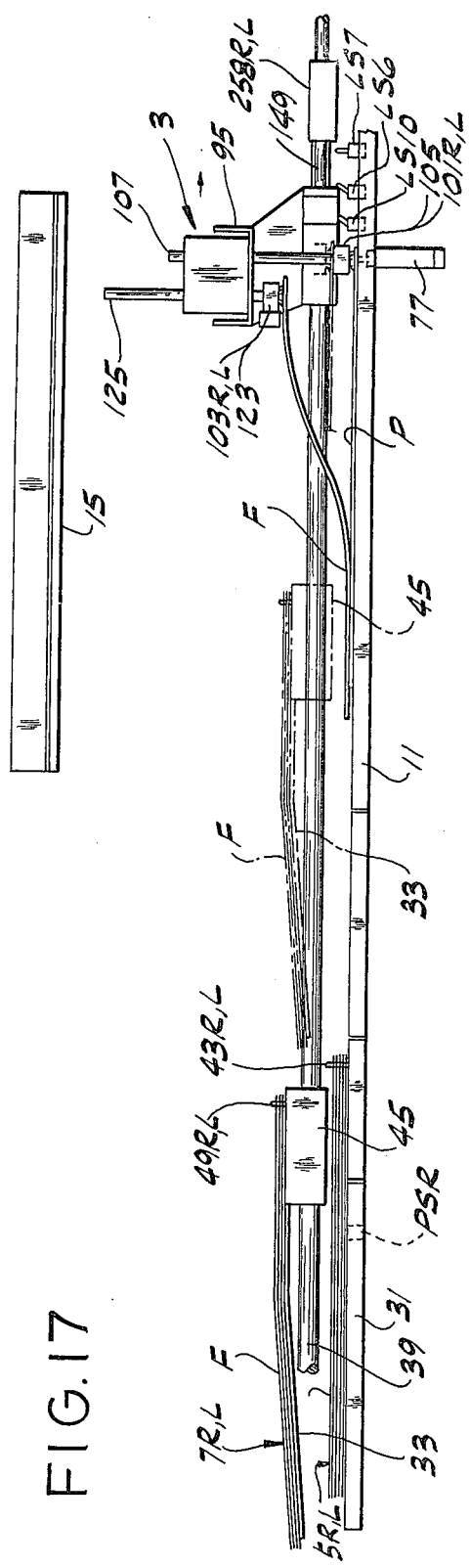
Figures 18, 19:
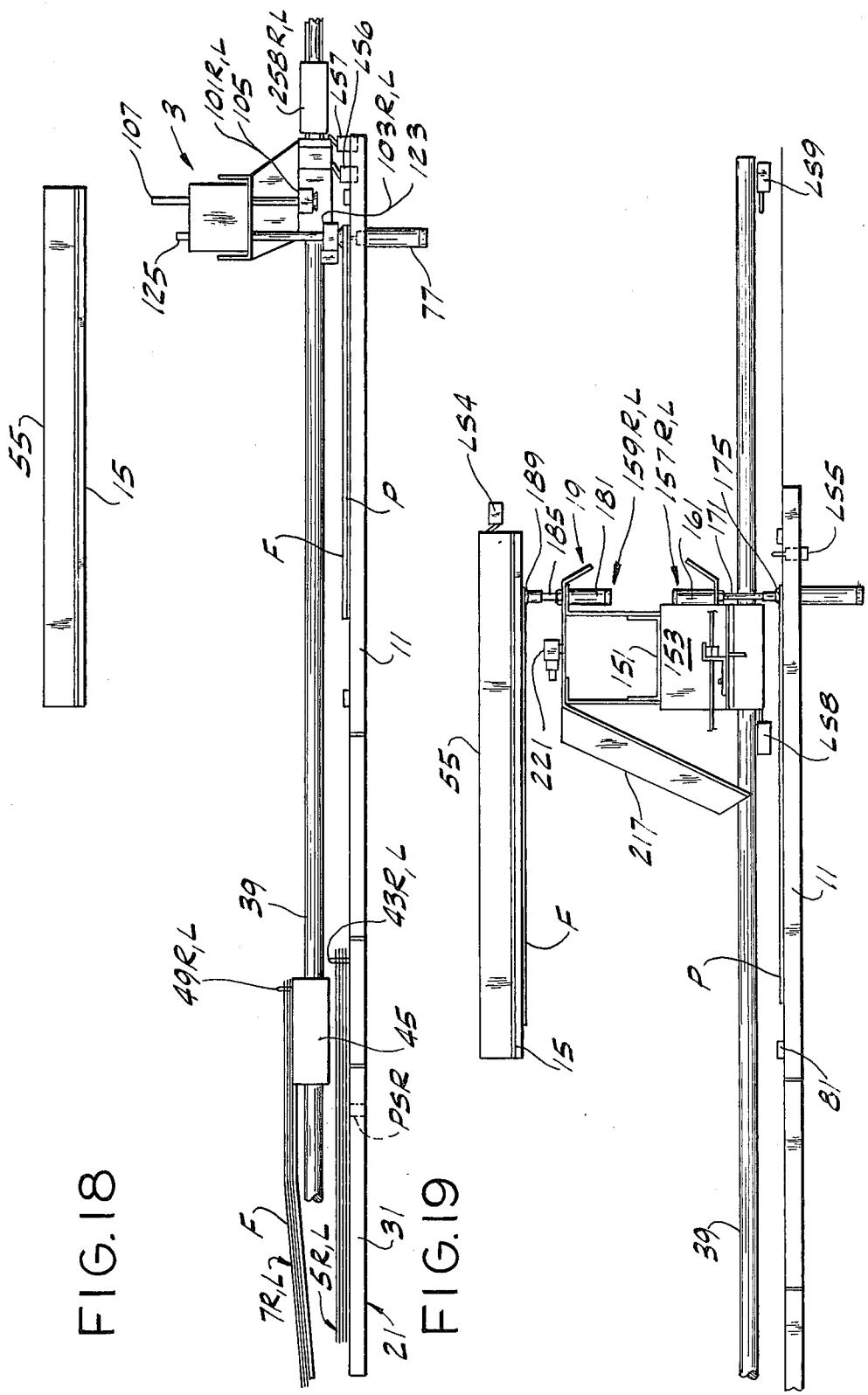
FIG. 19 is a view showing a step in the discharge of plates and films from the exposure station.

Means generally designated 143 is provided for operating the carriage 3 and the plate and film gripper means 101L,R and 103L,R:

To actuate the plate gripper means 101L,R (i.e., draw a vacuum in cups 111) to pick up the top plates from the plate stacks 5L and 5R and to actuate the film gripper means 103L,R (i.e., draw a vacuum in cups 127) to pick up the top films from the film stacks 7L and 7R when the carriage is in its retracted pickup position, with each picked-up film F offset rearward from the respective picked-up plate P (see FIG. 11);

To move the carriage 3 forward to the first forward or "plate registration" position in the exposure station 9 illustrated in FIG. 17 determined by engagement of the carriage with a pair of air-cylinder controlled stops each designated 149, one at the left and the other at the right, for infeed of the two plates which were picked up by the plate gripper means 101L,R to a position wherein the registration holes 23 in the plates are aligned with the registration pins 71L and 71R so that the plates are adapted on being lowered and released (as will appear) to occupy the exposure positions 13L and 13R;

To lower and deactuate the plate gripper means 101L,R to deposit each plate in its respective exposure position registered on pins 71L,R;

To advance the carriage 3 farther forward a distance (e.g. two inches) corresponding to the offset of the film stacks 7L,R from the plate stacks 5L,R to the second forward or "film registration" position in the exposure station illustrated in FIG. 18 wherein the films gripped by 103L and 103R are adapted on being lowered and released to overlie the plates in the exposure positions 13L and 13R;

To lower and deactuate the film gripper means 103L,R to deposit the films in exposure position overlying the plates and registered on the pins 71L,R; and To raise the gripper means and return the carriage 3 to its retracted pickup position.

Means 143 comprises a pair of air-operated cable cylinders each designated 145 (see FIGS. 2 and 13A), one at the left and the other at the right, for moving the carriage 3 forward and rearward on the rails 39, the cables 147 of these cylinders being suitably attached to the carriage, and valves and limit switches to be described controlling the valves.

The carriage 19 and the vacuum gripper means carried thereby constitutes means for discharging or taking away exposed plates and films from the exposure station 9, being movable rearward from the forward position forward of the exposure station in which it is illustrated in FIGS. 1 and 2 when the window 15 is raised to the rearward pickup position in which it is illustrated in FIG. 19 between the platen 11 and the raised window 15. It comprises an elongate channel-section bridge member 151 mounted at its ends on supports 153 on guide bushings 155 slidable on the left and right side rails 39, the channel 151 extending transversely of the apparatus at an elevation above that of the platen 11 and below that of the raised window 15. Plate discharge vacuum gripper means 157L is movable up and down on the carriage at the left for gripping the exposed plate in exposure position 13L at the left on the platen 11 and similar plate discharge vacuum gripper means 157R is movable up and down on the carriage at the right for gripping the exposed plate in exposure position 13R at the right on the platen. Film discharge vacuum gripper means 159L is movable up and down on the carriage at the left for gripping the film retained on the bottom of the raised window 15 at the left, and similar film discharge vacuum gripper means 159R is movable up and down on the carriage at the right for gripping the film retained on the bottom of the raised window 15 at the right.

Each of the left-hand and right-hand plate discharge means 157L and 157R comprises a pair of air cylinders each designated 161 mounted in vertical position head end up and rod end down on a flange 163 at the bottom of a bracket 165 adjustably mounted as indicated at 167 on the forward flange 169 of the channel 151. The piston rod 171 of each of these cylinders extends down through the flange. A suction cup holder 173 extends down from the lower end of the piston rod and has a suction cup 175 at its lower end. The suction cup holders are interconnected as indicated at 177 and a flexible vacuum line 179 is attached to the interconnection 177 for drawing a vacuum in the suction cups.

Each of the left-hand and right-hand film discharge means 159L and 159R comprises a pair of air cylinders each designated 181 mounted in vertical position rod end up and head end down on a flange 183 at the top of the bracket 163. The piston rod 185 of each of these cylinders extends up through the flange. A suction cup holder 187 extends up from the upper end of the piston rod and has a suction cup 189 at its upper end. The suction cup holders 187 are interconnected as indicated at 191 and a flexible vacuum line 193 is attached to the interconnection 191 for drawing a vacuum in the suction cups 189.

Means generally designated 195 is provided for operating the discharge carriage 19 and the discharge plate and film gripper means 157L,R and 159L,R:

To move the discharge carriage 19 from its forward position (FIGS. 1 and 2, its home position) to its rearward position (see FIG. 19) between the platen 11 and the raised window 15, the plate gripper means 157L,R being in raised position and the film gripper means 159L,R being in lowered position as this occurs;

To lower the plate gripper means 157L,R and actuate them (i.e., draw a vacuum in cups 175) to grip the exposed plates at the exposure position 13L on the platen 11 at the exposure station 9;

To raise the film gripper means 159L,R and actuate them (i.e., draw a vacuum in cups 189) to grip the films which were lifted up and retained on the bottom of the window 15;

To raise the plate gripper means 157L,R to raise the exposed plates;

To lower the film gripper means 159L,R to lower the films, generally simultaneously with release of the films from the window off the window;

To move the discharge carriage 19 forward to its forward position, carrying the exposed plates and the films forward along with it; and To deactuate the gripper means 157L,R and 159L,R to release the plates and films for discharge.

Means 195 comprises an air-operated cable cylinder 197 for moving the discharge carriage 19 rearward and forward on the rails 39, the cable 199 of this cylinder being suitably attached to the discharge carriage, and valves and limit switches to be described controlling the valves. It includes a pneumatic circuit for the air cylinders 161 and 181 comprising an air delivery line 201 on the carriage 19 connected as indicated at 203 to the upper ends of air cylinders 161 and as indicated at 205 to the lower ends of cylinders 181, and a flexible air supply line 206 connected to line 201. Cylinders 161 and 181 are spring return cylinders.

The discharge carriage 19, in moving to its forward (home) position, carries the exposed plates and the films to be discharged out of the exposure station 9. When the carriage 19 reaches its forward position, the vacuum grip on the plates is released, and the plates drop onto a belt conveyor 207 (see FIGS. 1 and 2) which feeds them out of the forward (exit) end of the apparatus and onto a second belt conveyor 209 for delivery to a plate processor (not shown). These conveyors are driven by a motor 211. The rearward end of conveyor 207 is spaced forward of the forward edge 11a of the platen 11, so that there is a film passage 213 between them. Also, when the discharge carriage reaches its forward position, the vacuum grip of cups 189 on the films is released. Extending up from the rearward flange of the channel member 155 are supports 215 for a film discharge chute 217 for discharge of the films down at the rear of the discharge carriage through the film passage 213. The film chute 217 inclines downwardly and rearwardly from a top plate 219 mounted on the supports 215. Air nozzles 221 are mounted at the left and right on the plate 219 for blowing the films released from the suction cups 189 rearward so that they slide down the chute and fall through the passage 213. The films falling through passage 213 drop onto a film return conveyor 223 (FIG. 1) which extends under the platen 11 toward the rear end of the apparatus and which delivers the films to a tray 225. This conveyor is driven by a motor 226.

Figure 13A:
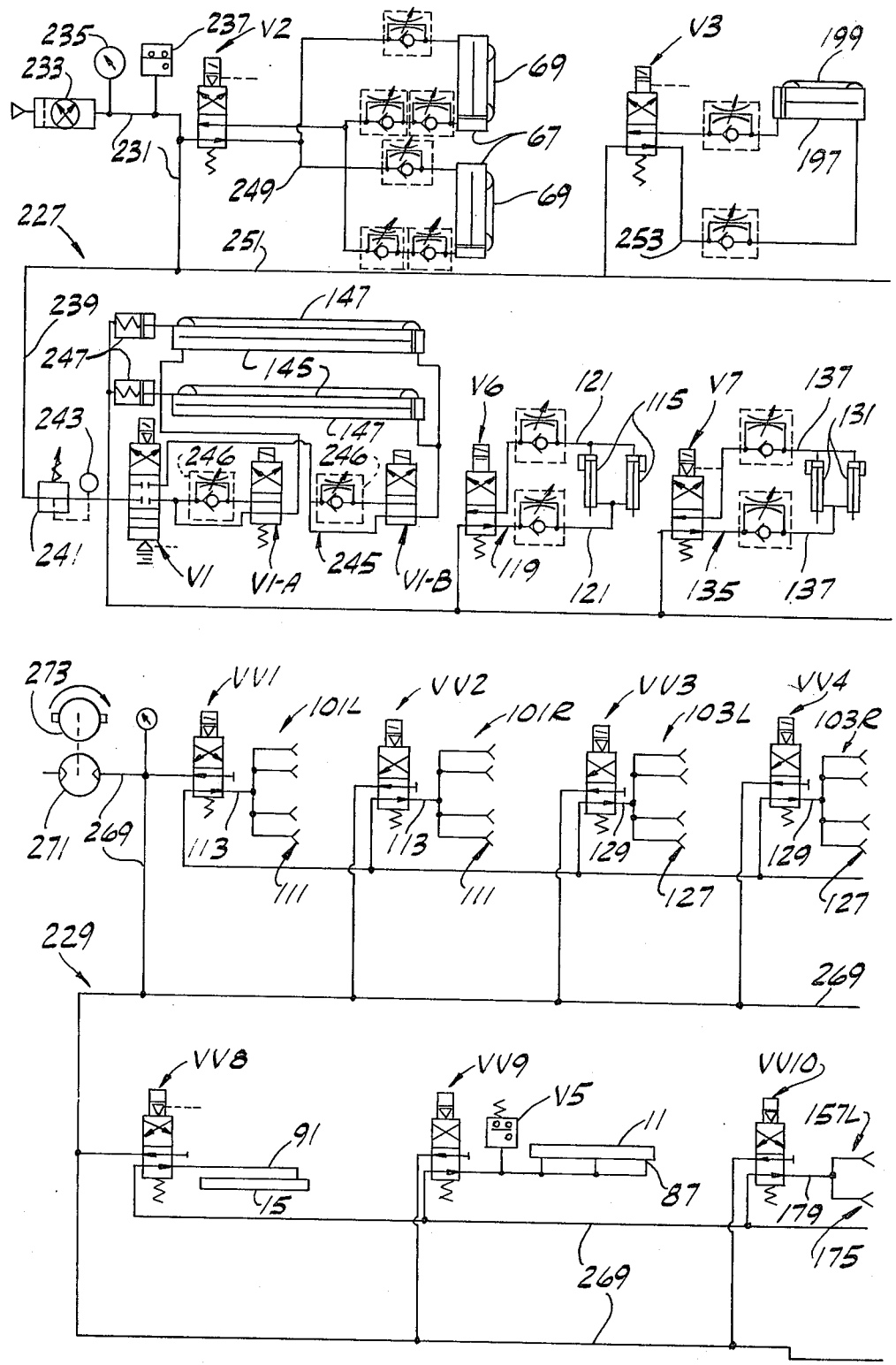
FIGS. 13A and B are diagrams of the pneumatic (compressed air and vacuum) circuitry of the apparatus.
Figure 13B:
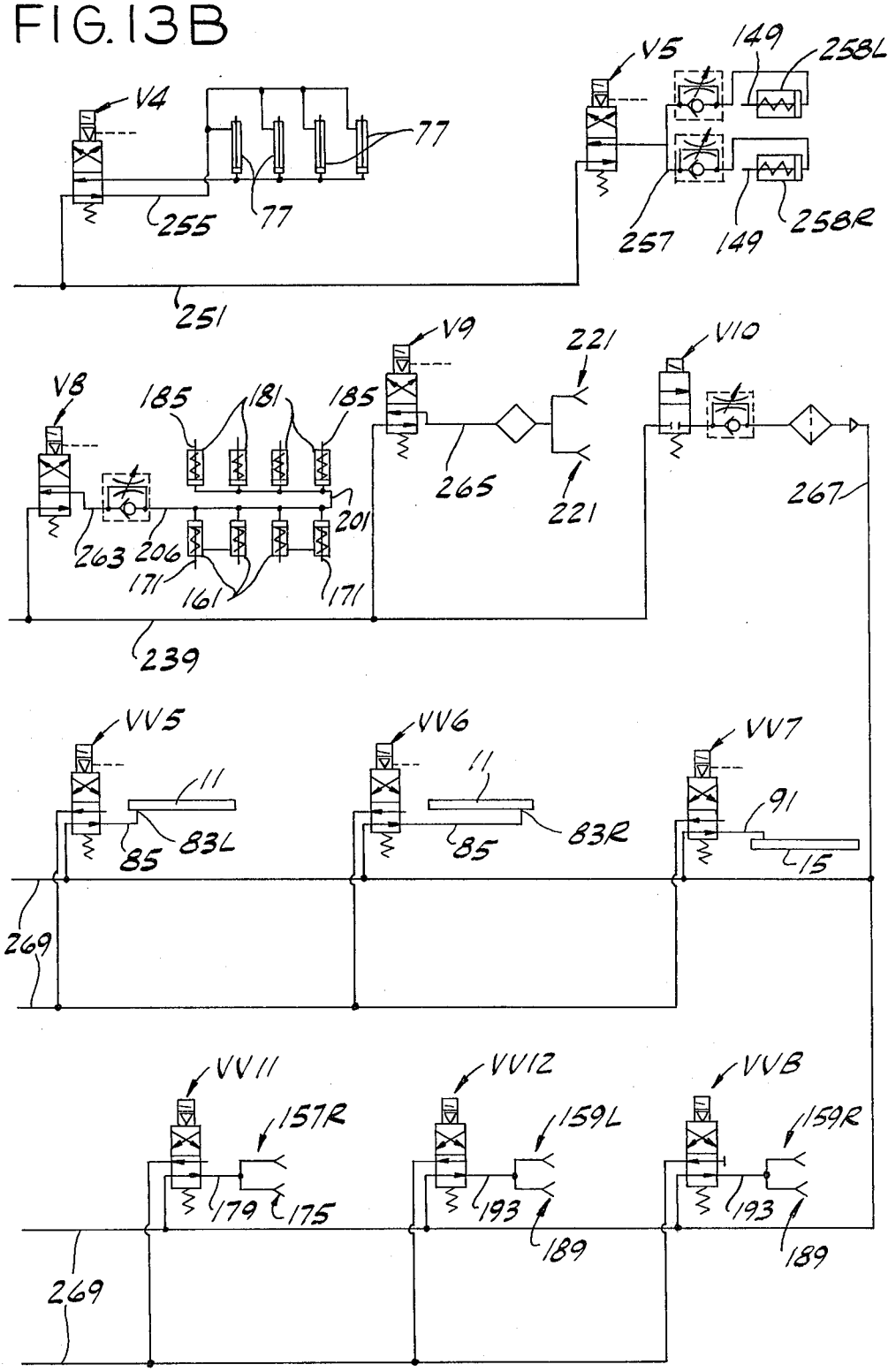
Figure 15:
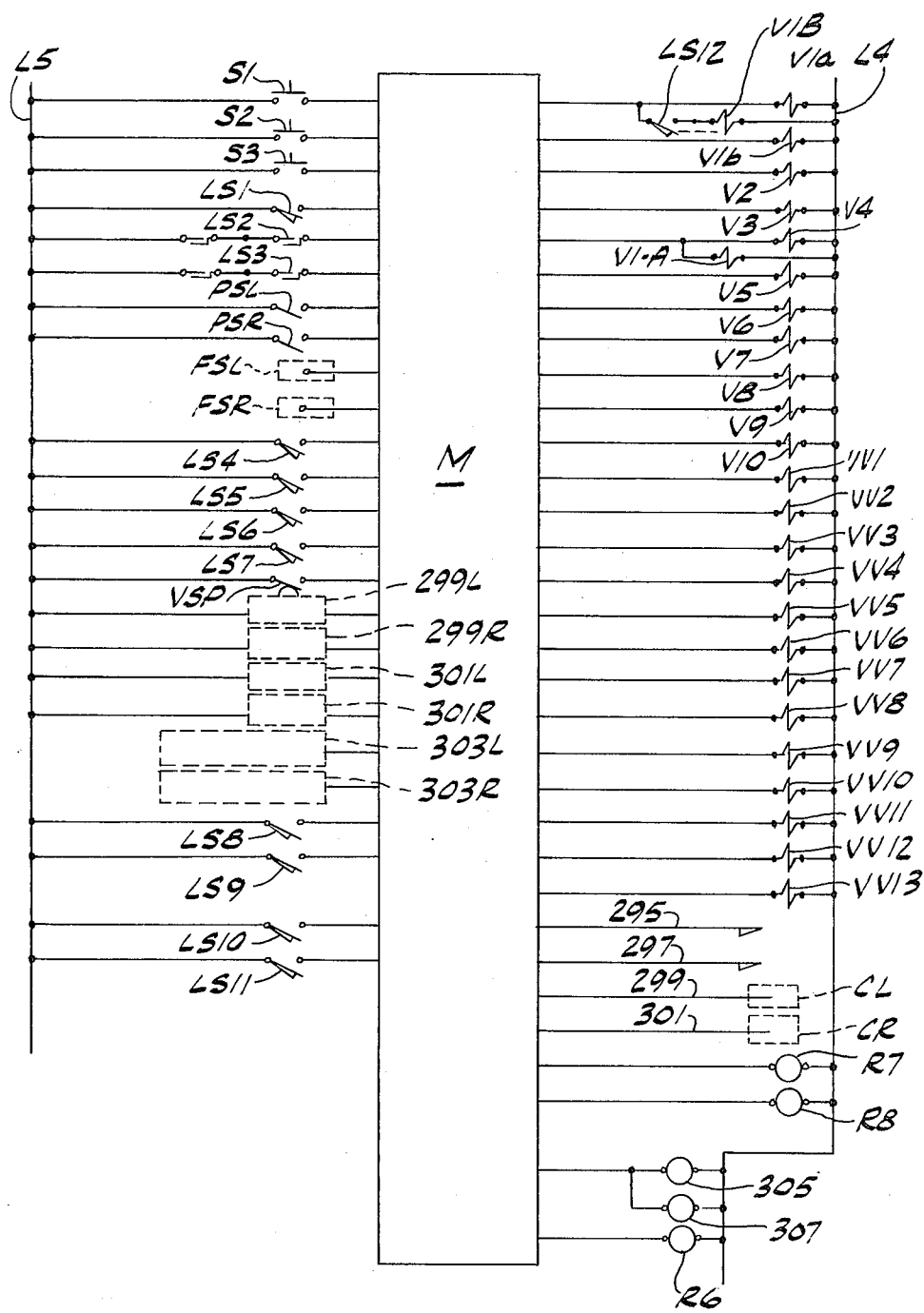
Figure 16:
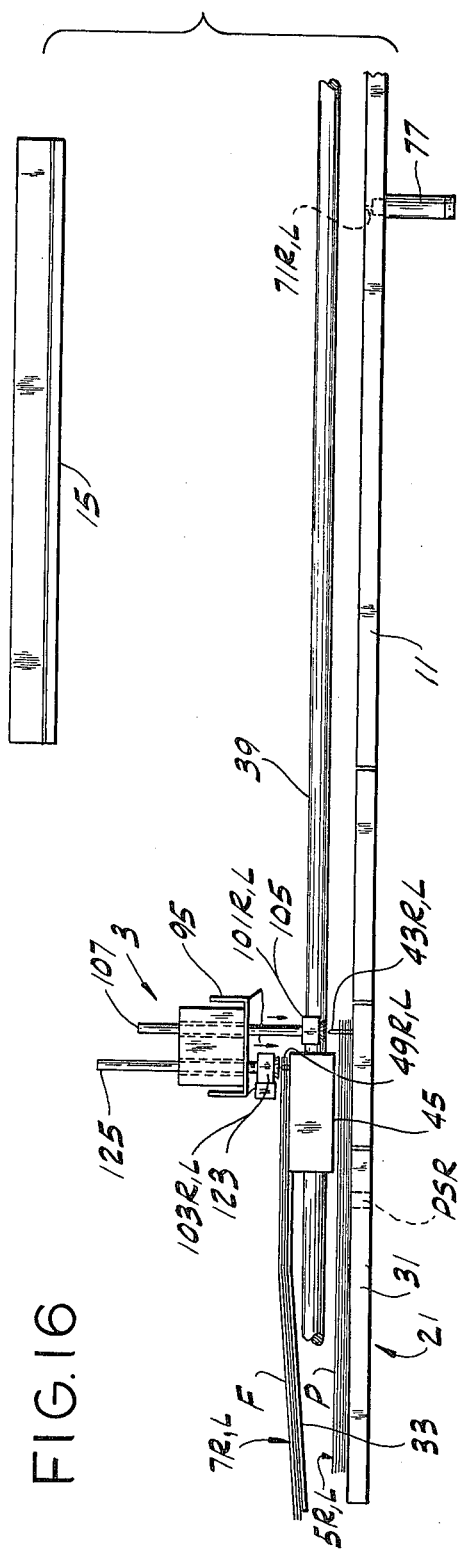
FIGS. 16-18 are views showing steps in the operation of feeding plates and films to the exposure station for exposure of the plates to light through the films.

The apparatus has an air system 227 and a vacuum system 229 as shown in FIGS. 13A,B, the air system having a line 231 for supplying compressed air to the apparatus including a pressure regulator 233, a pressure gauge 235 and a pressure switch 237. Line 231 feeds a line 239 including a pressure regulator 241 and a pressure gauge 243 which in turn feeds a solenoid valve V1 controlling a pneumatic circuit 245 including solenoid deceleration valves V1-A and V1-B for the two delivery carriage cylinders 145. Flow controls are indicated at 246. Line 239 also feeds tension cylinders 247 for tensioning the cables of cylinders 145. Valve VI as indicated in FIG. 15 has two coils V1a and V1b and the system is such that when V1a is energized, the delivery carriage 3 is moved rearward to its retracted or pickup position (which may be regarded as its home position) and when V1b is energized, the delivery carriage is moved forward. Valve V1-A acts to decelerate the carriage as it approaches its stated first forward position, and valve V1-B acts to decelerate the carriage toward the end of its return to its pickup position.

Line 231 feeds a solenoid valve V2 controlling a pneumatic circuit 249 including air cylinders 67 for raising and lowering the window 15, the window being raised when the valve is deenergized and lowered when the valve is energized. Line 231 also feeds a line 251 feeding solenoid valves V3–V5. Valve V3 is interconnected as indicated at 253 with the discharge carriage cylinder 197 in such manner that when valve V3 is deenergized the discharge carriage 19 is moved to its forward (home) position, and when valve V3 is energized, carriage 19 moves to its rearward position at the exposure station 9. Valve V4 is interconnected as indicated at 255 with the four registration pin cylinders 77 in such manner that when valve V4 is deenergized, the registration pins 71L and 71R are down, and when valve V4 is energized, these pins are up. Valve V5 is interconnected as indicated at 257 with left and right hand delivery carriage stop cylinders 258L and 258R for carriage stops 149 in such manner that when valve V5 is deenergized, the carriage stops are retracted, and when valve V5 is energized, these stops are extended to stop the delivery carriage 3 in its stated first forward or plate registration position. Line 239 feeds solenoid valves V6–V10. Valve V6 is interconnected as indicated at 259 with the two plate pickup cylinders 115 on the delivery carriage 3 in such manner that when valve V6 is deenergized, the plate pickup heads 105 are raised, and when valve V6 is energized, the plate pickup heads 105 are lowered to pick up plates P from the plate stacks 5L, 5R. Valve V7 is interconnected as indicated at 261 with the film pickup cylinders 131 on the delivery carriage 3 in such manner that when valve V7 is deenergized, the film pickup heads 123 are raised, and when valve V7 is energized the heads 123 are lowered to pick up films from the film stacks 7L, 7R. Valve V8 is interconnected as indicated at 263 with the plate and film pickup cylinders 161 and 181 on the discharge carriage 19 in such manner that when the valve is deenergized, these cylinders are vented, the plate suction cups 175 are up and the film suction cups 189 are down, and when the valve is energized, the cups 175 move down and the cups 189 move up. Valve V9 is interconnected as indicated at 265 with the nozzles 221, the arrangement being such that with the valve deenergized, flow of air to the nozzles is cut off, and when the valve is energized, air blows out of the nozzles. Valve V10 is interconnected as indicated at 267 with the vacuum system and operable on being energized to deliver a shot of air to the vacuum system 229 for quickly relieving vacuum in the vacuum system.

The vacuum system 229 has a vacuum line 269 in which a vacuum is drawn by a vacuum pump 271 driven by a motor 273 interconnected with vacuum solenoid valves VV1 to VV13. Valves VV1 to VV4 are respectively interconnected with the plate pickup cups 111 of the left-hand plate gripper means 101L, the right-hand plate pickup cups 111 of the right-hand plate gripper means 101R, the left-hand film pickup cups 127 of the left-hand film gripper means 103L and the right-hand film pickup cups 127 of the right-hand film gripper means 103R. Valves VV5 and VV6 are respectively interconnected with the left-hand set 83L and the right-hand set 83R of vacuum grooves in platen 11. Valves VV7 and VV8 are respectively interconnected with the left-hand set 17L and the right-hand set 17R of vacuum grooves in the bottom of the window 15. Valve VV9 is interconnected with the set 87 of vacuum grooves in the platen 11. Valves VV10 and VV11 are respectively interconnected with the plate gripper cups 175 of the left-hand gripper means 157L and the plate gripper cups 175 of the right-hand gripper means 157R on the discharge carriage 19. Valves VV12 and VV13 are respectively interconnected with the film gripper cups 189 of the left-hand gripper means 159L and the film gripper cups 189 of the right-hand gripper means 159R on the discharge carriage.

Referring to FIG. 14, main power supply lines for the apparatus are indicated at L1 and L2. The motor 273 for driving the vacuum pump 271 is connected across these lines under control of contacts R1a of a relay R1. The motor 211 for driving the plate conveyors 207 and 209 is connected across these lines under control of contacts R2a of a relay R2. The motor 226 for driving the film conveyor 225 is connected across these lines under control of contacts R3a of a relay R3. A power supply system 275 for the left-hand lamp 73L is powered via lines L1 and L2, this system including contacts R4a of a relay R4. A similar power supply system 279 for the right-hand lamp 73R is powered via lines L1 and L2, this system including contacts R4b of relay R4. Lines L3 and L4 are connected to the secondary of a transformer 282 powered from lines L1 and L2. A control switch 283 (an on-off switch) is connected in series with pressure switch 237 and a control relay R5 across lines L3 and L4. Contacts R5a of relay R5 complete a circuit 287 to a line L5 when relay R5 is energized. Relay R4 is connected across lines L5 and L4. Relays R1, R2 and R3 are connected in parallel with one another and in series with contacts R6a of a relay R6 (see FIG. 15) across lines L5 and L4. An integrator 287L for the left-hand lamp 73L is connected across lines L5 and L4 in series with contacts R6a (see FIG. 15) via a line L6. Its operation is triggered on closure of contacts R7a (FIG. 14) of a relay R7 (FIG. 15). It controls the left-hand lamp power supply unit 275 via a line 289. Similarly, an integrator 287R for the right-hand lamp 73R is connected across lines L6 and L4. Its operation is triggered on closure of contacts R8a (FIG. 14) of relay R8 (FIG. 15). It controls the right-hand lamp power supply unit 279 via a line 291. These integrators are identical, each being of a standard commercially available type adapted on initiation of its operation to integrate light falling on it and to operate via the respective line 289, 291 to turn off the respective lamp power supply 275, 279 when the amount of light reaches a value (set by adjustment of the integrator) needed for proper exposure of plates. A counter CL for the left-hand exposure line 1L is connected across lines L6 and L4 under control of contacts R7b of relay R7 and a similar counter CR for the right-hand exposure line 1R is connected across lines L6 and L4 under control of contacts R8b of relay R8. A film sensor system FSL for the left-hand line 1L is connected across lines L5 and L4, and a film sensor system FSR for the right-hand line 1R is connected across lines L5 and L4.

Referring to FIG. 15, there is indicated at M a microcomputer which is programmed for operation of the apparatus as hereinafter described. Manually operable (push button) switches S1, S2 and S3 and limit switches LS1–LS11 are connected in input lines to the microcomputer as illustrated. S1 is a start switch (it may be referred to as the "Process" switch). S2 is a stop switch (it may be referred to as the "Cancel" switch). S3 may be referred to as the "Load Plate" switch, being operable to drive the carriage 3 forward from its pickup position to clear the table 31 for loading plates P on the table at 5L and 5R. LS1 (see also FIGS. 7 and 8) is operable by carriage 3 as, in moving rearward, it reaches its pickup (retracted) position. There are two LS2 switches (see FIGS. 3 and 11); these are actuated in response to retraction of the piston rods 117 of air cylinders 115 to drive the plate pickup heads 105 to their raised position. There are two LS3 switches (see FIGS. 3 and 11); these are actuated in response to retraction of the piston rods 133 of air cylinders 131 to drive the film pickup heads 123 to their raised position. LS4 (FIG. 12) is operable in response to the window 15 reaching its raised position, and LS5 (FIG. 12) is operable in response to the window reaching its lowered position. LS6 (FIG. 17) is operable in response to the carriage 3 reaching its first forward or plate registration position of FIG. 17. LS7 (FIG. 18) is operable in response to carriage 3 reaching its second forward or film registration position of FIG. 18. LS8 (FIG. 19) is responsive to carriage 19, in moving rearward, reaching its rearward position for gripping a plate and film at the exposure station. LS9 (FIG. 19) is responsive to carriage 19, in moving forward, reaching its forward position. LS10 (Fig. 17) is a deceleration switch, operable as the carriage 3 approaches its plate registration position of FIG. 17. LS11 left and right plate proximity or plate sensing switches PSL and PSR are provided in the table for sensing the presence of plates P at 5L and 5R, and are connected in input lines as illustrated from line L5 to the microcomputer. The left and right film sensing systems FSL and FSR are low-voltage systems including contacts 293 (FIGS. 11 and 14) carried by the left and right film pickup heads 123 are connected in input lines as illustrated in FIG. 15 to the microcomputer. These sense the presence of films at 7L and 7R by engagement with films if present, the films then preventing electrical contact of contacts 299 with tray 33 which is wired in the circuit, and sense the absence of films by contact with the tray 33. The arrangement is such that in the absence of films, film sensor system FSL acts to transmit a signal via a line 301 and FSR acts to transmit a signal via a line 303 to the microcomputer. Systems FSL and FSR may be replaced by photoelectric systems. A vacuum switch VS (see also Fig. 13A) which is operable on sufficient vacuum (e.g. 23" Hg) being drawn in the space between the window 15 (when down) and the platen 11 for causing the window to press the films down on the plates at 13L and 13R is connected in an input line from line L5 to the microcomputer.

Again referring to FIG. 15, coils V1a and V1b of air valve V1, air valves V2-V10, vacuum valves VV1-VV13 and relays R6-R8 are connected in output lines from the microcomputer to line L4. Deceleration valve V1-B and a limit switch LS12 (see also FIGS. 7 and 8) responsive to carriage 3, in moving rearward, approaching its retracted pickup position, are connected in series coil V12 of valve V1. Deceleration valve V1-A is connected in parallel with valve V4. Outputs from the microcomputer to the left and right lamp power supplies 275 and 279 are indicated at 295 and 297 (see also FIG. 14). A control 299L for the left counter CL is connected between line L5 and the microcomputer, this control being triggered from the left integrator 287L. Similarly, a start control 299R for the right counter CR is connected between line L5 and the microcomputer, this control being triggered from the right integrator 287R. A stop control 301L for the left counter, operable when the left counter has completed the count for which it has been set, is connected between line L5 and the microcomputer. The integrators 287L and 287R have controls indicated at 303L and 303R connected to the microcomputer. Alarms indicated at 305 and 307 for signalling absence of plates and/or films at the stocking station 21 are connected in a microcomputer output.

A housing for the apparatus as indicated at 3; this is generally similar to that shown in detail in the aforesaid U.S. Pat. No. 3,810,694. Suitable switches may be provided in the circuit shown in FIG. 15 to inhibit operation of the apparatus if a door of the apparatus or cover for the stacking station is left open.

Operation is as follows:

Generally, at the start of operations, the delivery or infeed carriage 3 is back in its retracted or plate and film pickup position of FIGS. 1, 2, 7 and 16, the discharge carriage 19 is forward in its discharge position of FIGS. 1 and 2, and the window 15 is in its raised position. Control switch 283 is turned on and, with air pressure on line 231 and pressure switch 237 thereby closed, relay R5 is energized and its contacts R5a are closed so that relay R4 is energized and its contacts R4a and R4b (FIG. 14) close to activate the lamp power units 275 and 279, which are allowed time to warm up. With contacts R5a closed, a circuit for line L5 is completed. Start switch S1 is actuated, energizing relay R6 (FIG. 15) and closing its contacts R6a (FIG. 14) thereby to energize relays R1, R2 and R3 and line L6. Relay contacts R1a, R2a and R3a close to energize the vacuum pump motor 273 and the conveyor motors 211 and 226. Switch S3, via the microcomputer, energizes coil V1b of valve V1 to actuate air cylinders 145 to drive the carriage 3 forward all the way to its first forward or plate registration position of FIG. 17 (window 15 being raised). The film stacking tray 33 is slid forward to the position in which it is indicated in phantom in FIG. 17. This clears the way for stacking plates P at 5L and 5R on pins 43L and 43R. In an actual embodiment of the machine, up to 200 plates may be stacked on each set of pins (400 plates total). The operator then slides the tray 33 back and stacks films F on it at 7L and 7R on pins 49L and 49R and latches it in its pickup position of FIGS. 1, 2, 7 and 16. In the stated embodiment, up to 50 films may be stacked on each set of pins (100 films total). Latching the tray in the pickup position actuates limit switch LS11. Counters CL and CR are set for the number of plates to be exposed to a film in the left-hand exposure line 1L and the number of plates to be exposed to a film in right-hand exposure line 1R. For initial purposes of illustration, it will be assumed that one plate from the left-hand plate stack at 5L is to be exposed to a film from the left-hand film stack at 7L, and one plate from the right-hand plate stack 5R is to be exposed to a film from the right-hand film stack 7R. Now, assuming plates and films are so loaded, the apparatus is ready for exposing the plates to light through the films at the exposure station 9, but if plates and/or films have not been so loaded, and there are no plates at 5L or 5R or films at 7L or 7R, the operation proceeds on actuation of the "Process" or start switch S1 through steps 1-9 as follows:

1. Relay R6 is energized via the microcomputer, and its contacts R6a close to energize relays R1, R2 and R3 and close contacts R1a, R2a and R3a to energize the vacuum pump motor 273 and the conveyor motors 211 and 226.

2. Actuation of switch S1 results in energization of coil V1a of valve V1 via the microcomputer to actuate air cylinders 145 to return the carriage 3 to its plate and film pickup position (its retracted or home position) of FIGS. 1, 2, 7 and 16, noting that it had been previously moved forward for the stacking operations at station 21. As carriage 3 approaches its pickup position, it actuates the deceleration limit switch LS12 energizing the deceleration valve V1-B to slow the carriage down. The slowed-down carriage 3 is stopped at the pickup position by engagement with the stops 94, and as it reaches this position it actuates the limit switch LS1.

3. On actuation of limit switch LS1, valves V6 and V7 are energized via the microcomputer, and (provided tray 33 is in the pickup position and limit switch LS11 is thereby actuated) these valves actuate air cylinders 115 and 131 to drive down the plate and film pickup heads 105 and 123. The heads come down to the point where the suction cups 111 of the left and right plate pickup heads engage the top plates P of the left and right plate stacks at 5L and 5R, and the suction cups 127 of the left and right film pickup heads engage the top films F of the left and right film stacks at 7L and 7R, as illustrated in FIG. 11.

4. With films at 7L and 7R, the film sensor systems FSL and FSR are inactive, and after a one second delay, as programmed via the microcomputer, vacuum valve VV3 for the left-hand film gripper means 103L comprising the left-hand film pickup head 123 is energized to draw a vacuum in the suction cups 127 of this pickup head to grip the top film F of the left-hand film stack 7L (see FIG. 11). If there aren't any films at 7L,R, the film sensor systems FSL, FSR supply no-film signals and valve VV3 is deenergized.

5. With plates at 5L and 5R, the plate sensors PSL, PSR supply signals to that effect, and assuming valve VV3 remains energized, valve VV1 is energized to draw a vacuum in the suction cups 111 of the left-hand plate pickup head 105 (left-hand plate gripper means 101L) to grip the top plate P of the left-hand stack of plates 5L. But if there aren't any plates at 5L, 5R, both valves VV1 and VV3 are deenergized, so that vacuum to the suction cups of the left-hand plate and film pickup heads (gripper means 101L and 103L) is cut off.

6. If there aren't any plates or films to pick up, valves V6 and V7 are deenergized, resulting in raising of the plate and film pickup heads 105 and 123 (without picking up any plates or films), with attendant actuation of the limit switches LS2 and LS3 as the pickup heads reach their raised positions.

7. Upon actuation of limit switches LS2 and LS3, coil V1b of valve V1 is energized via the microcomputer to actuate air cylinders 145 to drive the carriage 3 forward so as to enable the operator to load plates at 5L,R. Alarms 305, 307 are energized to alert the operator to load plates. Having loaded the plates, the operator again actuates switch S1 and steps 1 and 2 are repeated (with return of the carriage 3 to its pickup position of FIGS. 1, 2, 6, 7 and 16).

8. Now, with carriage 3 in the pickup position, the plate and film pickup heads 105 and 123 are lowered as in step 3 and with plates and films present (meaning no "empty" signal), valve VV4 is energized and a vacuum is thereby drawn in the suction cups 127 of the right-hand film gripper means 103R comprising the right-hand film pickup head 123 to grip the top film of the right-hand stack 7R (see FIG. 11). If there are no films at 7R, valve VV4 is not energized, and valves V6 and V7 are deenergized to raise the pickup heads.

9. Valve VV2 is energized to draw a vacuum in the suction cups 111 of the right-hand plate pickup head 105 to grip the top plate of the right-hand stack of plates (see FIG. 11). If there are no plates at 5R, then step 7 is repeated for plate loading.

Thus, in the initial phase of operation, the apparatus functions to determine whether there are plates on table 31 at 5L and films on the tray at 7L (via the left-hand plate sensor PSL and the left-hand film sensor system FSL), and then to determine whether there are plates on the table at 5R and films on the tray at 7R (via PSR and FSR). If there are no films at 7L, valve VV3 is deenergized. If there are films at 7L, but no plates at 5L, all the pickup heads are raised (step 6) and the carriage 3 moves forward to allow for the loading of plates at 5L (and at 5R, if needed). Then, on actuating switch S1 again, the carriage 3 returns and checks for films on the tray 33 at 7R. If there are no films at 7R, valve VV4 is deenergized. Then, with films at 7L, 7R and plates at 5L, 5R, the program may proceed through steps 10–32, as follows:

10. Valves V6 and V7 (which had been energized to actuate cylinders 115 and 131 to lower the plate and film pickup heads 105 and 123) are deenergized, with resultant actuation of these cylinders to raise the plate and film pickup heads. Valves VV1–VV4 are all energized at this time, so that vacuum is drawn in the suction cups 111, 127 of the two plate pickup heads 105 and the two film pickup heads 123. Accordingly, the two plate pickup heads 105 pick up the top plates P of the stacks at 5L, 5R, raising the plates off pins 43L,R, and the two film pickup heads 123 pick up the top films of the film stacks at 7L,R, raising the films off pins 49L,R. The picked-up films F are disposed above and offset rearward (e.g. two inches) from the picked-up plates P. Limit switches LS2 and LS3 are tripped at the upper limit of the upstroke of heads 105 and 123.

11. In response to the tripping of the limit switches LS2 and LS3, coil V1b of valve V1 is energized and valve V1 actuates cylinders 145 to drive the carriage 3 forward, the carriage thereby carrying the two gripped plates P and the two gripped films F forward into the exposure station 9, window 15 being raised at this time. Also in response to the tripping of limit switches LS2 and LS3, the cylinders 258L,R for the carriage stops 149 are actuated to extend these stops (i.e. move them rearward to the end of their rearward stroke) and hold them there against the return bias of the springs in the cylinders, as shown in Fig. 17.

12. Carriage 3 slides forward on the rails 39 into engagement with the extended stops 149, determining its stated first forward or plate registration position (Fig. 17) wherein the registration holes 23 in the two plates brought into the exposure station 9 by the carriage are aligned with the registration pins 71L,R. As the carriage approaches this position, it trips the deceleration limit switch LS10 to actuate valve V1A to slow the carriage down so that it comes gently to a stop in engagement with the extended stops 149, and also to actuate valve V4 to actuate cylinders 77 extend the registration pins 71L,R to their raised position of FIG. 12.

13. As the carriage 3 reaches its plate registration position of FIG. 17, it trips limit switch LS6. After a delay of one second, for example, valve V6 is energized to actuate cylinders 115 to drive the plate pickup heads 105 down to deposit the plates P on the platen 11 with the plates registered on the extended pins 71L,R. Valves VV1 and VV2 are then deenergized to cut off vacuum in the suction cups 111 on both plate pickup heads 105 (101L and 101R) so that the two plates P are released to lie on the platen registered by pins 71L,R in the exposure positions 13L,R.

14. After a delay of 0.5 seconds, for example, valve V6 is deenergized to actuate cylinders 115 to move both plate pickup heads 105 back to their raised position.

This actuates limit switches LS2, thereby deenergizing valve V8, which deactuates stop cylinders 258L,R for spring retraction of the carriage stops 149. These stops are retracted a distance corresponding to the offset of pins 49L,R from pins 43L,R (e.g. two inches).

15. Upon retraction of stops 149, the carriage 3, still under the influence of cylinders 145 tending to move it forward, travels forward the stated offset distance (e.g. two inches) to bring the two films F to the registration position in which it appears in FIG. 18 wherein the registration holes 49L,R in the films are aligned with the registration pins 71L,R. This actuates limit switch LS7. After a delay of one second, for example, valve V7 is energized to drive the film pickup heads 123 down to deposit the films F on the plates P on platen 11 with the films registered on the registration pins 71L,R along with the plates P at 13L and 13R. Valves VV3 and VV4 are deenergized to cut off vacuum in the suction cups 127 of the film pickup heads 123 (103L,R) for releasing the films from the cups. Valves VV7 and VV8 are also energized at this time to draw vacuum in the two sets of film-gripping vacuum grooves 17L and R in the bottom of window 15.

16. After a delay of 0.5 seconds, for example, valve V7 is deenergized, thereby actuating cylinders 131 to drive the film pickup heads 123 back up to their raised position, leaving the released films F on the plates P at positions 13L and 13R, registered on pins 71L,R. On raising the heads, switches LS3 are deactuated, energizing coil V1a of valve V1 to actuate cylinders 145 to drive carriage 3 back to its retracted pickup position with the plate and film pickup heads 105 and 123 raised as described.

17. As the carriage 3 slides rearward, limit switch LS10 is deactuated, and this effects energization of valves VV10 and VV11 to draw a vacuum in the two sets of grooves 83L and 83R to vacuum grip the plates at 13L and 13R down on the platen 11.

18. As the carriage 3 approaches its retracted pickup position, it actuates limit switch LS12 to energize valve V1B to decelerate the carriage.

19. As the carriage 3 reaches its pickup position it actuates limit switch L1.

20. With LS1 actuated by carriage 3 and LS9 actuated by carriage 19 (in its forward position), valve V2 is energized to actuate air cylinders 69 to lower the window 15. As the window engages the sealing strip 81, limit switch LS5 is actuated.

21. On actuation of LS5, valve VV9 is energized to draw a vacuum in the set of vacuum grooves 87 in the platen, the window then being forced down by atmospheric pressure on the films and plates at 13L and 13R, sealing strip 81 being squeezed.

22. When the vacuum drawn by 87 in the sealed space between the platen 11 and the window 15 bounded by the sealing strip 81 reaches a predetermined value (e.g. 23 Hg), switch VSP is actuated. This energizes the integrator start relays R7 and R8, closing their contacts R7a and R8a to start the light integrating action of integrators 287L,R, and closing the counter contacts R7b and R8b to start their counting action.

23. The left and right-hand lamps 73L and 73R are energized by power supplies 275 and 279 triggered by signals via lines 295 and 297 for the exposure of the two plates P at the exposure positions 13L and R to light through the films F on the plates, for an interval of time determined by the integrators 287L,R. During this exposure interval, back at the stacking station 21, the apparatus progresses through the operations described in steps 3–10 to check for the presence of plates at 5L,R and films at 7L,R and, assuming there are plates and films at 5L,R and 7L,R for processing, picks up the next plates and films for being transported to the exposure station.

24. Valves VV8 and VV9, acting to draw a vacuum in grooves 17L and 17R in the bottom of the window 15, effect vacuum gripping of the films at 13L and 13R to the bottom of the window. Valve V2 is deenergized to actuate air cylinders 67 to raise the window 15, the two films F through which the two plates P at 13L and 13R were just exposed being raised along with the window and held up thereby as shown in FIG. 19. The plates stay down on the platen 11.

25. The window 15 is driven up to its raised retracted position, actuating limit switch LS4.

26. Steps 11–25 are repeated for the next cycle, limit switches LS2 and LS3 having been tripped on rising of the pickup heads 105 and 123 back at the stacking station 21. In the course of this repeat, carriage 3 delivers two new plates P and two new films F to the exposure positions 13L and R, and again returns to its retracted pickup position.

27. While carriage 3 is returning to pickup position (step 16 in the course of the repeat of steps 11–25), valve V3 is energized to actuate air cylinder 197 to drive the discharge carriage 19 rearward to its pickup position of FIG. 19 above the two plates P at 13L,R and below the two films F on the bottom of the raised window 15.

28. Carriage 19 trips limit switch LS8 (see Fig. 19) thereby energizing valves V8 and VV10-13. Valves VV12 and VV13 are energized at this time because counters CL and CR have been set for exposing only one plate through each of the films. Both plate gripper means 157L,R on carriage 19 move down for engagement of their suction cups 175 with the plates at 13L,R, and both film gripper means 159L,R move up for engagement of their suction cups 189 with the films on the bottom of the window, and vacuum is drawn in all these suction cups for gripping the plates and the films.

29. After a delay (e.g. one second) valves VV5–VV8 are deenergized, thereby cutting off the vacuum in grooves 83L,R in the platen 11 and in grooves 17L,R in bottom of the window, so as to release the plates from the platen and the films from the window for discharge.

30. After a further delay (e.g. 0.5 seconds) valves V8 and V3 are deenergized. The springs in cylinders 161 return the plate gripper means 157L,R to the up position and the springs in cylinders 181 return the film gripper means to the down position, and cylinder 197 is actuated by V3 to drive carriage 19 forward to its forward or home position of FIGS. 1 and 2, carrying the two exposed plates and the two used films out of the exposure station 9 to the discharge position shown in FIG. 1.

31. When carriage 19 reaches the stated discharge position of FIG. 1, it actuates limit switch LS9. Valves VV10 and VV11 are thereupon deenergized, cutting off the vacuum in the plate gripper cups 175 and the film gripper cups 189. The plates P, thus released, drop into conveyor 207 and are fed forward to conveyor 209 and thence into the plate processor (not shown).

32. Valve V9 is energized and nozzles 221 blow air back on the released films F for their assured discharge down the chute 217 through the space 213 and onto conveyor 223, which feeds them rearward to the tray 225 under the table 31.

As will appear from the above, carriage 3 travels forward and delivers unexposed plates P from 5L and R and films from stacks 7L and R to the exposure station 9 for a processing cycle at the same time that carriage 19 travels forward and discharges exposed plates and films from the exposure station. And carriage 3 travels back to its retracted pickup position and picks up plates and films from the stacks for the next cycle as carriage 19 travels back to its pickup position to pick up the plates and films to be discharged. This makes for rapid and efficient processing. In effect, each cycle (i.e. pickup and delivery of plates and films to the exposure station, exposure of the plates to light through the films, and discharge of the exposed plates and the films) starts before the preceding cycle is completed. Step 26 (described as a repeat of steps 11-25) involves the delivery of plates and films to the exposure station and their exposure as part of one cycle before completion of the preceding cycle. The apparatus remains in operation until switch S2 is actuated or until the last film of either film stack 7L, 7R has been processed, as detected with the carriage 3 back in its retracted position by contact 293 of the respective film sensor system FSL or FSR engaging the tray 33, either of which results in deenergization of relay R6, opening contacts R6a and thereby shutting the apparatus off.

Assuming for example that two plates P from stack 5L are to be exposed to light through the same film F from stack 7L and two plates P from stack 5R are to be exposed to light through the same film F from stack 7R, each of the counters CL and CR is set for exposure of two plates instead of one. Operation then proceeds as above described except that after the first plate from 5L has been exposed at 13L and the first plate from 5R has been exposed at 13R, the two films are retained on the bottom of window 15 after it has been raised, the exposed plates are discharged, new plates but not films are delivered to exposure positions 13L and 13R, the window lowered, and the retained films applied to the new plates. With the counters set for two instead of one, valves VV12 and VV13 remain deenergized when carriage 19 moves rearward to its pickup position and thus refrain from drawing a vacuum in the film discharge pickup cups 189, 159L,R, instead of being energized as noted in step 28. Also, valves VV7 and VV8 remain energized to maintain the vacuum in the grooves 17L,R in the bottom of the window to retain the two films F gripped to the bottom of window (retaining their position of registry with respect to pins 71L,R). Also, valves VV3 and VV4 remain deenergized so that no vacuum is drawn in the film pickup cups 127 on carriage 3, omitting pickup of films from stacks 7L,R. Thus, carriage 3 picks up two new plates only, no films, and on its ensuing forward stroke delivers the two new plates to the exposure positions 13L and R. The window 15 is then lowered and the retained films F are applied to the new (second) plates and released. Following the exposure of the second plates, the films are raised by the window, but this time vacuum in grooves 17L and R is cut off and vacuum is drawn in cups 189 for the discharge of the films along with the second plates. The carriage 3 then brings in two new plates and two new films, and the process repeats itself until switch S2 is actuated or the supply of films is exhausted.

Counters CL and CR may be set for exposure of more than two plates in the respective exposure line 1L or 1R through the same film. And counters CL and CR may be set for exposure of different numbers of plates to light through a film in each of the two exposure lines 1L and 1R (e.g., two plates per film in line 1L, four plates per film in line 1R).

While the apparatus is disclosed in its preferred realization as one having two exposure lines 1L and 1R, it will be understood that the principles of the invention are applicable to apparatus having only one exposure line, or more than two exposure lines.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for exposing photosensitized plates to light through films comprising:

means for holding a stack of plates to be exposed and a stack of films through which plates are to be exposed, with the stack of films above and offset in a rearward direction from the stack of plates so that the stack of plates extends forward from under the stack of films;

an exposure station at which a plate is exposed to light through a film, said exposure station being located forward of the stack holding means;

means for delivering a plate from the plate stack and a film from the film stack to an exposure position at the exposure station comprising a carriage movable forward from a retracted position over the stacks to the exposure station, and rearward back to retracted position, and plate gripper means and film gripper means movable up and down on the carriage, the film gripper means being adapted to grip the top plate of the plate stack forward of the film stack and the film gripper means being offset rearward from the plate gripper means for gripping the top film of the film stack;

and means for operating the carriage, the plate gripper means and the film gripper means to actuate the plate gripper means when the carriage is in retracted position to pick up a plate from the plate stack and to actuate the film gripper means when the carriage is in retracted position to pick up a film from the film stack with the film above and offset rearward from the plate, to move the carriage to a first forward position at the exposure station wherein the plate is adapted on being released to occupy its exposure position, to lower the plate gripper means and release the plate to deposit the plate in exposure position, to advance the carriage farther forward a distance corresponding to the offset of the film from the plate to a second forward position at the exposure station wherein the film is adapted on being released to overlie a plate in exposure position, to lower the film gripper means and release the film to deposit the film in exposure position overlying the plate, and to raise the gripper means and return the carriage to retracted position.

2. Apparatus as set forth in claim 1 for handling plates and films with registration holes, having registration pins extending upwardly at the exposure station on which a plate and film may be registered in exposure position by means of the holes, the holes in the plate registering with the pins when the carriage moves to said first forward position and said operating means then acting to move the plate gripper means down to lower the plate onto the pins and then release the plate, and the holes in the film registering with the pins when the carriage advances to said second forward position and said operating means then being operable to lower the film gripper means to lower the film onto the pins and then release the film.

3. Apparatus as set forth in claim 1 having means at the exposure station for supporting a plate and a film on the plate, a window movable downwardly from a raised retracted position above said supporting means to a lowered position for pressing the plate and film at the exposure station, and a light source for exposing the plate to light through the window and the film, the carriage being movable forward into the exposure station and back out of the exposure station between the supporting means and the raised window.

4. Apparatus as set forth in claim 3 for handling plates and films with registration holes wherein said supporting means comprises a platen at the exposure station, and wherein registration pins are provided on the platen on which a plate and film may be registered in exposure position on the platen by means of the holes, the holes in the plate registering with the pins when the carriage moves to said first forward position and said operating means then acting to move the plate gripper means down to lower the plate onto the pins and then release the plate, and the holes in the film registering with the pins when the carriage advances to said second forward position and said operating means then being operable to lower the film gripper means to lower the film onto the pins and then release the film.

5. Apparatus as set forth in claim 3 having means associated with the window operable after exposure of a plate to light through a film at the exposure station to grip the film to the bottom of the window, the film being raised by the window away from the exposed plate when the window is then raised.

6. Apparatus as set forth in claim 5 having means for discharging the exposed plate and the raised film from the exposure station.

7. Apparatus as set forth in claim 6 wherein the means for gripping a film to the bottom of the window is operable to retain a film gripped to the bottom of the window while an exposed plate is discharged, and wherein the means for operating the delivery carriage and plate gripper means thereon is operable to deliver an additional plate or plates from the plate stack to exposure position at the exposure station for exposure thereof through the retained film.

8. Apparatus as set forth in claim 6 wherein the discharge means comprises a discharge carriage movable from a forward position forward of the exposure station to a rearward position over the plate in exposure position at the exposure station, plate discharge gripper means movable up and down on the discharge carriage, and means for operating the discharge carriage and plate discharge gripper means to move the discharge carriage to its said rearward position, lower the plate discharge gripper means and actuate it to grip the exposed plate, raise it to lift the exposed plate, and then move the discharge carriage forward to its forward position and deactuate the plate discharge gripper means to release the exposed plate.

9. Apparatus as set forth in claim 6 wherein the discharge means comprises a discharge carriage movable from a forward position forward of the exposure station to a rearward position under a film retained on the bottom of the raised window, film discharge gripper means movable up and down on the discharge carriage, and means for operating the discharge carriage and film discharge gripper means to move the discharge carriage to its said rearward position, raise the film discharge gripper means and actuate it to grip the film, lower it to lower the film, with accompanying release of the film from the window, and then move the discharge carriage forward to its forward position and deactuate the film discharge gripper means to release the film.

10. Apparatus as set forth in claim 6 wherein the discharge means comprises a discharge carriage movable from a forward position forward of the exposure station to a rearward position between the exposed plate and the film retained on the bottom of the raised window at the exposure station, plate discharge gripper means and film discharge gripper means movable up and down on the carriage, and means for operating the discharge carriage and the discharge gripper means to move the discharge carriage to its said rearward position, lower the plate discharge gripper means, actuate it to grip the exposed plate and raise it to raise the exposed plate, raise the film discharge gripper means, actuate it to grip the film, lower it to lower the film, with accompanying release of the film from the window, and then moving the discharge carriage forward to its forward position and deactuating the discharge gripper means to release the plate and the film.

11. Apparatus as set forth in claim 10 wherein the means for gripping a film to the bottom of the window is operable to retain a film gripped to the bottom of the window while the discharge carriage, with its plate gripper means actuated and its film gripper means deactuated, discharges an exposed plate, and wherein the means for operating the delivery carriage and plate gripper means thereon is operable to deliver an additional plate or plates from the plate stack to exposure position at the exposure station for exposure thereof through the retained film.

12. Apparatus as set forth in claim 1 wherein the stack-holding means comprises a table on which the stack of plates is placed and a film stack holder above the table on which the stack of films is placed.

13. Apparatus as set forth in claim 12 for handling plates and films with registration holes, and having registration pins extending up from the table for registering the plates in the plate stack, and registration pins extending up from the film stack holder for registering the films in the film stack.

14. Apparatus as set forth in claim 13 wherein the film stack holder is movable away from an operating position, wherein the film registration pins are offset rearward from the plate registration pins a predetermined distance for said rearward offset of the stack of films from the stack of plates, to a position for stacking plates on the table on the plate registrations pins, and back to operating position.

15. Apparatus as set forth in claim 1 having stop means engageable by the carriage movable between a first position for determining said first forward position of the carriage and a second position for determining said second forward position of the carriage.

16. Apparatus as set forth in claim 1 wherein the plate gripper means comprises a head carrying downwardly facing suction cups for vacuum gripping a plate, and the film gripper means comprises a head carrying downwardly facing suction cups offset rearward from said plate gripper head for vacuum gripping a film, said apparatus having air cylinders on the carriage for moving the heads up and down, and means for drawing a vacuum in the cups.

17. Apparatus as set forth in claim 10 wherein the plate discharge gripper means comprises downwardly facing suction cup means for vacuum gripping a plate, said apparatus having air cylinder means on the discharge carriage for moving said suction cup means down for gripping a plate and up to pick up the plate for carrying it away, and the film discharge gripper means comprises upwardly facing suction cup means for vacuum gripping a film, said apparatus having air cylinder means on the discharge carriage for moving the latter suction cup means up for gripping a film and down for carrying the film away.

18. Apparatus as set forth in claim 17 having an exit conveyor forward of the exposure station for receiving a plate released from the plate discharge suction cup means when the discharge carriage is in its forward position.

19. Apparatus as set forth in claim 18 having a space between the exposure station and the rearward end of the exit conveyor, said discharge carriage having a chute for travel of a film released from the film discharge suction cups when the discharge carriage is in its forward position back from the discharge carriage and down through said space.

20. Apparatus as set forth in claim 19 having means on the discharge carriage for blowing the released film back for sliding down the chute.

21. Apparatus for exposing photosensitized plates to light through films comprising:

means for holding side-by-side two stacks of plates to be exposed and two stacks of films through which plates are to be exposed, with each stack of films above and offset in a rearward direction from a respective stack of plates so that each stack of plates extends forward from under the respective stack of films;

an exposure station at which each of two plates may be exposed to light through a film, with the two plates and the films on the plates in side-by-side exposure positions, said exposure station being located forward of the stack holding means;

means for delivering a plate from each of the plate stacks and a film from each of the film stacks to the respective exposure position at the exposure station comprising a single carriage movable forward from a retracted position over the stacks to the exposure station, and rearward back to retracted position, and two plate gripper means, one for each plate stack, and two film gripper means, one for each film stack, movable up and down on the carriage, each film gripper means being adapted to grip the top plate of the respective plate stack forward of the respective film stack and each film gripper means being offset rearward from the respective plate gripper means for gripping the top film of the respective film stack;

and means for operating the carriage and each plate and film gripper means to actuate each plate gripper means and each film gripper means when the carriage is in retracted position to pick up a plate from each plate stack and a film from each film stack with each film above and offset rearward from the respective plate, to move the carriage to a first forward position at the exposure station wherein each plate is adapted on being released to occupy its exposure position, to lower each plate gripper means and release the respective plate to deposit it in exposure position, to advance the carriage farther forward a distance corresponding to the offset of the film from the plate to a second forward position at the exposure station wherein each film is adapted on being released to overlie the respective plate in the respective exposure position, to lower each film gripper means and release the respective film to deposit it in exposure position overlying the respective plate, and to raise the gripper means and return the carriage to retracted position.

22. Apparatus as set forth in claim 21 for handling plates and films with registration holes, having two sets of registration pins extending upwardly at the exposure station located for registration of a plate and film on each set in each exposure position by means of the holes, the holes in each plate registering with the pins of the respective set when the carriage moves to said first forward position and said operating means then being operable to move each plate gripper means down to lower the respective plate onto the pins of the respective set and then release the plate, and the holes in each film registering with the pins of the respective set when the carriage advances to said second forward position and said operating means then being operable to lower each film gripper means to lower the respective film onto the pins of the respective set and then release the film.

23. Apparatus as set forth in claim 21 having means at the exposure station for supporting two plates and a film on each plate, a window movable downwardly from a raised retracted position above said supporting means to a lowered position for pressing the plates and films at the exposure station, and two side-by-side light sources for exposing the plates to light through the window and the films, the carriage being movable forward into the exposure station and back out of the exposure station between the supporting means and the raised window.

24. Apparatus as set forth in claim 23 for handling plates and films with registration holes wherein said supporting means comprises a platen at the exposure station, and wherein two sets of registration pins are provided on the platen located for registration of a plate and film on each set in each exposure position on the platen by means of the holes, the holes in each plate registering with the pins of the respective set when the carriage moves to said first forward position and said operating means then being operable to move each plate gripper means down to lower the respective plate onto the pins of the respective set and then release the plate, and the holes in each film registering with the pins of the respective set when the carriage advances to said second forward position and said operating means then being operable to lower each film gripper means to lower the respective film onto the pins of the respective set and then release the film.

25. Apparatus as set forth in claim 23 having means associated with the window operable after exposure of plates to light through films at the exposure station to grip the films to the bottom of the window, the films being raised by the window away from the exposed plate when the window is then raised.

26. Apparatus as set forth in claim 25 having means for discharging the exposed plates and the raised films from the exposure station.

27. Apparatus as set forth in claim 26 wherein the means for gripping the films to the bottom of the window is operable to retain the films gripped to the bottom of the window while an exposed plate is discharged, and wherein the means for operating the delivery carriage and plate gripper means thereon is operable to deliver additional plates from the plate stacks to the exposure positions at the exposure station for exposure thereof through the retained films.

28. Apparatus as set forth in claim 26 wherein the discharge means comprises a discharge carriage movable from a forward position forward of the exposure station to a rearward position over the two plates in exposure position at the exposure station, two plate discharge gripper means, one for each of said two plates, movable up and down on the discharge carriage, and means for operating the discharge carriage and each plate discharge gripper means to move the discharge carriage to its said rearward position, lower each plate discharge gripper means and actuate it to grip the respective exposed plate, raise it to lift the respective exposed plate, and then move the discharge carriage forward to its forward position and deactuate each plate discharge gripper means to release the respective exposed plate.

29. Apparatus as set forth in claim 26 wherein the discharge means comprises a discharge carriage movable from a forward position forward of the exposure station to a rearward position under two films retained on the bottom of the raised window, two film discharge gripper means, one for each of said two films, movable up and down on the discharge carriage, and means for operating the discharge carriage and each film discharge gripper means to move the discharge carriage to its said rearward position, raise each film discharge gripper means and actuate it to grip the respective film, lower it to lower the respective film, with accompanying release of the film from the window, and then move the discharge carriage forward to its forward position and deactuate each film discharge gripper means to release the respective film.

30. Apparatus as set forth in claim 26 wherein the discharge means comprises a discharge carriage movable from a forward position forward of the exposure station to a rearward position between two exposed plates and two films retained on the bottom of the raised window at the exposure station, two plate discharge gripper means, one for each of said two plates, and two film discharge gripper means, one for each of said two films, movable up and down on the carriage, and means for operating the discharge carriage and the discharge gripper means to move the discharge carriage to its said rearward position, lower each plate discharge gripper means, actuate it to grip the respective exposed plate and raise it to raise the exposed plate, raise each film discharge gripper means, actuate it to grip the respective film, lower it to lower the film, with accompanying release of the film from the window, and then moving the discharge carriage forward to its forward position and deactuating each discharge gripper means to release the plates and the films.

31. Apparatus as set forth in claim 30 wherein the means for gripping the films to the bottom of the window is operable to retain the films gripped to the bottom of the window while the discharge carriage, with its two plate gripper means actuated and its two film gripper means deactuated, discharges exposed plates, and wherein the means for operating the delivery carriage and the two plate gripper means thereon is operable to deliver an additional plate or plates from each plate stack to exposure position at the exposure station for exposure of each additional plate or plates thereof through a retained film.

32. Apparatus as set forth in claim 21 wherein the stack-holding means comprises a table on which the stacks of plates are placed, and a film stack holder above the table on which the stacks of films are placed.

33. Apparatus as set forth in claim 32 for handling plates and films with registration holes, and having two sets of registration pins extending up from the table for registering the plates in the two plate stacks, and two sets of registration pins extending up from the film stack holder for registering the films in the two film stacks.

34. Apparatus as set forth in claim 33 wherein the film stack holder is movable away from an operating position, wherein each set of film registration pins is offset rearward from each set of plate registration pins a predetermined distance for said rearward offset of the stacks of films from the stacks of plates, to a position for stacking plates on the table on the plate registrations pins, and back to operating position.

35. Apparatus as set forth in claim 21 having stop means engageable by the carriage movable between a first position for determining said first forward position of the carriage and a second position for determining said second forward position of the carriage.

36. Apparatus as set forth in claim 21 wherein each plate gripper means comprises a head carrying downwardly facing suction cups for vacuum gripping a plate, and each film gripper means comprises a head carrying downwardly facing suction cups offset rearward from said plate gripper head for vacuum gripping a film, said apparatus having air cylinders on the carriage for moving the heads up and down, and means for drawing a vacuum in the cups.

37. Apparatus as set forth in claim 30 wherein each plate discharge gripper means comprises downwardly facing suction cup means for vacuum gripping a plate, said apparatus having air cylinder means on the discharge carriage for moving each said suction cup means down for gripping a plate and up to pick up the plate for carrying it away, and each film discharge gripper means comprises upwardly facing suction cup means for vacuum gripping a film, said apparatus having air cylinder means on the discharge carriage for moving each said film gripping suction cup means up for gripping a film and down for carrying the film away.

38. Apparatus as set forth in claim 37 having an exit conveyor forward of the exposure station for receiving plates released from the plate discharge suction cup means when the discharge carriage is in its forward position.

39. Apparatus as set forth in claim 38 having a space between the exposure station and the rearward end of the exit conveyor, said discharge carriage having a chute for travel of films released from the film discharge suction cups when the discharge carriage is in its forward position back from the discharge carriage and down through said space.

40. Apparatus as set forth in claim 39 having means on the discharge carriage for blowing the released films back for sliding down the chute.

41. Apparatus for exposing photosensitized plates to light through films comprising:

means for delivering a plate and a film to an exposure station at which the plate is exposed to light through the film;

means at the exposure station for supporting the plate and the film on the plate;

a window movable downwardly from a raised retracted position above said supporting means to a lowered position for pressing the plate and film at the exposure station;

a light source for exposing the plate to light through the window and the film;

means associated with the window operable after exposure of a plate to light through a film at the exposure station to grip the film to the bottom of the window, the film being raised by the window away from the exposed plate when the window is then raised; and means for discharging the exposed plate and the raised film from the exposure station comprising a discharge carriage movable from a forward position forward of the exposure station to a rearward position between the exposed plate and the film retained on the bottom of the raised window at the exposure station, plate discharge gripper means and film discharge gripper means movable up and down on the carriage, and means for operating the discharge carriage and the discharge gripper means to move the discharge carriage to its said rearward position, lower the plate discharge gripper means, actuate it to grip the exposed plate and raise it to raise the exposed plate, raise the film discharge gripper means, actuate it to grip the film, lower it to lower the film, with accompanying release of the film from the window, and then moving the discharge carriage forward to its forward position and deactuating the discharge gripper means to release the plate and the film.

42. Apparatus as set forth in claim 41 wherein the plate discharge gripper means comprises downwardly facing suction cup means for vacuum gripping a plate, said apparatus having air cylinder means on the discharge carriage for moving said suction cup means down for gripping a plate and up to pick up the plate for carrying it away, and the film discharge gripper means comprises upwardly facing suction cup means for vacuum gripping a film, said apparatus having air cylinder means on the discharge carriage for moving the latter suction cup means up for gripping a film and down for carrying the film away.

43. Apparatus as set forth in claim 42 having an exit conveyor forward of the exposure station for receiving a plate released from the plate discharge suction cup means when the discharge carriage is in its forward position.

44. Apparatus as set forth in claim 43 having a space between the exposure station and the rearward end of the exit conveyor, said discharge carriage having a chute for travel of a film released from the film discharge suction cups when the discharge carriage is in its forward position back from the discharge carriage and down through said space.

45. Apparatus as set forth in claim 44 having means on the discharge carriage for blowing the released film back for sliding down the chute.

46. Apparatus for exposing photosensitized plates to light through films comprising:

means for delivering two plates and two films to an exposure station at which each plate is exposed to light through a film;

means at the exposure station for supporting the two plates side-by-side and the films on the plates;

a window movable downwardly from a raised retracted position above said supporting means to a lowered position for pressing the two plates and films at the exposure station;

two side-by-side light sources for exposing the plates to light through the window and the films;

means associated with the window operable after exposure of plates to light through films at the exposure station to grip the films to the bottom of the window, the films being raised by the window away from the exposed plates when the window is then raised; and means for discharging the exposed plates and the raised films from the exposure station comprising a discharge carriage movable from a forward position forward of the exposure station to a rearward position between the exposed plates and the films retained on the bottom of the raised window at the exposure station, two plate discharge gripper means, one for each of said two plates, and two film discharge gripper means, one for each of said two films, movable up and down on the carriage, and means for operating the discharge carriage and the discharge gripper means to move the discharge carriage to its said rearward position, lower each plate discharge gripper means, actuate it to grip the respective exposed plate and raise it to raise the exposed plate, raise each film discharge gripper means, actuate it to grip the respective film, lower it to lower the film, with accompanying release of the film from the window, and then moving the discharge carriage forward to its forward position and deactuating the discharge gripper means to release the plates and the films.

47. Apparatus as set forth in claim 46 wherein each plate discharge gripper means comprises downwardly facing suction cup means for vacuum gripping a plate, said apparatus having air cylinder means on the discharge carriage for moving said suction cup means down for gripping a plate and up to pick up the plate for carrying it away, and each film discharge gripper means comprises upwardly facing suction cup means for vacuum gripping a film, said apparatus having air cylinder means on the discharge carriage for moving the latter suction cup means up for gripping a film and down for carrying the film away.

48. Apparatus as set forth in claim 47 having an exit conveyor forward of the exposure station for receiving plates released from the plate discharge suction cup means when the discharge carriage is in its forward position.

49. Apparatus as set forth in claim 48 having a space between the exposure station and the rearward end of the exit conveyor, said discharge carriage having a chute for travel of films released from the film discharge suction cups when the discharge carriage is in its forward position back from the discharge carriage and down through said space.

50. Apparatus as set forth in claim 49 having means on the discharge carriage for blowing the released films back for sliding down the chute.

51. Apparatus for exposing photosensitized plates to light through films, the plates and films having registration pin holes, said apparatus comprising:
- an exposure station at which a plate is exposed to light through a film;
- said exposure station comprising a platen for supporting a plate and a film on the plate;
- registration pins extending up from the platen for entry in the registration pin holes of a plate and a film;
- means for holding a stack of plates to be exposed adjacent the exposure station in position for forward feed of the plates into the exposure station;
- said plate holding means comprising registration pins for entry in the registration holes of the plates in the stack; means for feeding a plate from the plate stack to a registered exposure position on the registration pins on the platen comprising a carriage movable forward from a retracted position over the stack to the exposure station, and rearward back to retracted position, and plate gripper means movable up and down on the carriage for gripping the top plate of the plate stack adjacent its forward edge;
- means for operating the carriage and the plate gripper means to actuate the plate gripper means when the carriage is in retracted position to grip the top plate of the stack adjacent the forward edge of the plate, pick up the plate from the plate stack, move the carriage forward to pull the plate forward to a position at the exposure station wherein the pin holes in the plate are in registry with the pins on the platen, lower the plate gripper means and release the plate to deposit the plate in registered exposure position, and raise the plate gripper means and return the carriage to retracted position;
- a window movable downwardly from a raised retracted position above the platen to a lowered position for pressing the plate and film at the exposure station;
- a light source for exposing the plate to light through the window and a film on the plate;
- means associated with the window operable after exposure of a plate to light through a film at the exposure station to grip the film to the bottom of the window, the film being raised by the window away from the exposed plate when the window is then raised; and means for discharging the exposed plate from the exposure station comprising a discharge carriage movable from a forward position forward of the exposure station to a rearward position between the exposed plate and the raised window at the exposure station, plate discharge gripper means movable up and down on the carriage, and means for operating the discharge carriage and the discharge gripper means to move the discharge carriage to its said rearward position, lower the plate discharge gripper means, actuate it to grip the exposed plate and raise it to raise the exposed plate, and then moving the discharge carriage forward to its forward position and deactuating the discharge gripper means to release the plate.

52. Apparatus as set forth in claim 51 wherein each plate gripper means comprises downwardly facing suction cup means for vacuum gripping a plate, said apparatus having air cylinder means on the carriages for moving said suction cup means down for gripping a plate and up to pick up the plate.

* * * * *

UNITED STATES PATENT AND TRADEMARK OFFICE
CERTIFICATE OF CORRECTION

PATENT NO. : 4,423,955

DATED : January 3, 1984

INVENTOR(S) : John W. Powers

It is certified that error appears in the above-identified patent and that said Letters Patent is hereby corrected as shown below:

Column 20, claim 1, line 37, "film" should read ---plate---.

Column 23, claim 21, line 56, "film" should read ---plate---.

Signed and Sealed this

Twenty-sixth Day of October, 1993

Attest:

BRUCE LEHMAN

*Attesting Officer*      *Commissioner of Patents and Trademarks*